(12) United States Patent
Minemura et al.

(10) Patent No.: US 11,031,415 B2
(45) Date of Patent: Jun. 8, 2021

(54) SEMICONDUCTOR STORAGE DEVICE

(71) Applicant: TOSHIBA MEMORY CORPORATION, Minato-ku (JP)

(72) Inventors: Yoichi Minemura, Yokkaichi (JP); Michiaki Matsuo, Nagoya (JP); Reiko Shamoto, Nagoya (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 21 days.

(21) Appl. No.: 16/560,416

(22) Filed: Sep. 4, 2019

(65) Prior Publication Data

US 2020/0303404 A1 Sep. 24, 2020

(30) Foreign Application Priority Data

Mar. 18, 2019 (JP) .............................. JP2019-050497

(51) Int. Cl.
| | |
|---|---|
| *H01L 27/11582* | (2017.01) |
| *G11C 16/04* | (2006.01) |
| *H01L 27/11573* | (2017.01) |
| *G11C 16/10* | (2006.01) |
| *G11C 16/08* | (2006.01) |
| *H01L 27/11565* | (2017.01) |
| *G11C 16/14* | (2006.01) |

(52) U.S. Cl.
CPC .... *H01L 27/11582* (2013.01); *G11C 16/0483* (2013.01); *G11C 16/08* (2013.01); *G11C 16/10* (2013.01); *G11C 16/14* (2013.01); *H01L 27/11565* (2013.01); *H01L 27/11573* (2013.01)

(58) Field of Classification Search
CPC ..................... G11C 16/0483; H01L 27/11582
USPC ................................................... 365/185.29
See application file for complete search history.

(56) References Cited

U.S. PATENT DOCUMENTS

| | | | |
|---|---|---|---|
| 9,460,805 B1 | 10/2016 | Pang et al. | |
| 9,543,022 B2 | 1/2017 | Hashimoto et al. | |
| 9,997,526 B2 * | 6/2018 | Sudo | H01L 27/11575 |
| 10,109,355 B2 | 10/2018 | Nagao | |
| 10,283,647 B2 * | 5/2019 | Matsuo | G11C 16/10 |
| 2014/0241063 A1 * | 8/2014 | Maeda | G11C 16/10 365/185.17 |
| 2017/0278860 A1 | 9/2017 | Aoyama | |
| 2018/0083027 A1 | 3/2018 | Yamabe et al. | |
| 2018/0277221 A1 | 9/2018 | Minemura | |

FOREIGN PATENT DOCUMENTS

| | | |
|---|---|---|
| JP | 2018-147535 A | 9/2018 |
| JP | 2018-160298 A | 10/2018 |

* cited by examiner

*Primary Examiner* — Muna A Techane
(74) *Attorney, Agent, or Firm* — Oblon, McClelland, Maier & Neustadt, L.L.P.

(57) ABSTRACT

According to one embodiment, in a semiconductor storage device, a peripheral circuit supplies a first voltage to a second region when supplying a select potential to a region corresponding to the second region, in a second conductive layer. The peripheral circuit supplies a second voltage higher than the first voltage to a first region when supplying a select potential to a region corresponding to the first region, in the second conductive layer.

20 Claims, 19 Drawing Sheets

| PHYSICAL LOCATION | | INITIAL START VOLTAGE $V_{ws}$ |
|---|---|---|
| BLOCK | REGION | |
| BLK0 | UUR | $V_{ws}1$ |
| BLK0 | ULR | $V_{ws}2$ |
| BLK0 | LUR | $V_{ws}3$ |
| BLK0 | LLR | $V_{ws}4$ |
| ⋮ | ⋮ | ⋮ |

| | SU3 (OUTER STRING UNIT) | SU2 (INNER STRING UNIT) | SU1 (INNER STRING UNIT) | SU0 (OUTER STRING UNIT) |
|---|---|---|---|---|
| UUR | $\Delta V_{WS}=0$ | $\Delta V_{WS}=\alpha 1$ ($\alpha 1>0$) | $\Delta V_{WS}=\alpha 1$ ($\alpha 1>0$) | $\Delta V_{WS}=0$ |
| ULR | $\Delta V_{WS}=0$ | $\Delta V_{WS}=\alpha 2$ ($\alpha 2<\alpha 1, \alpha 2>0$) | $\Delta V_{WS}=\alpha 2$ ($\alpha 2<\alpha 1, \alpha 2>0$) | $\Delta V_{WS}=0$ |
| LUR | $\Delta V_{WS}=0$ | $\Delta V_{WS}=\alpha 3$ ($\alpha 3<\alpha 2, \alpha 3>0$) | $\Delta V_{WS}=\alpha 3$ ($\alpha 3<\alpha 2, \alpha 3>0$) | $\Delta V_{WS}=0$ |
| LLR | $\Delta V_{WS}=0$ | $\Delta V_{WS}=\alpha 4$ ($\alpha 4<\alpha 3, \alpha 4>0$) | $\Delta V_{WS}=\alpha 4$ ($\alpha 4<\alpha 3, \alpha 4>0$) | $\Delta V_{WS}=0$ |

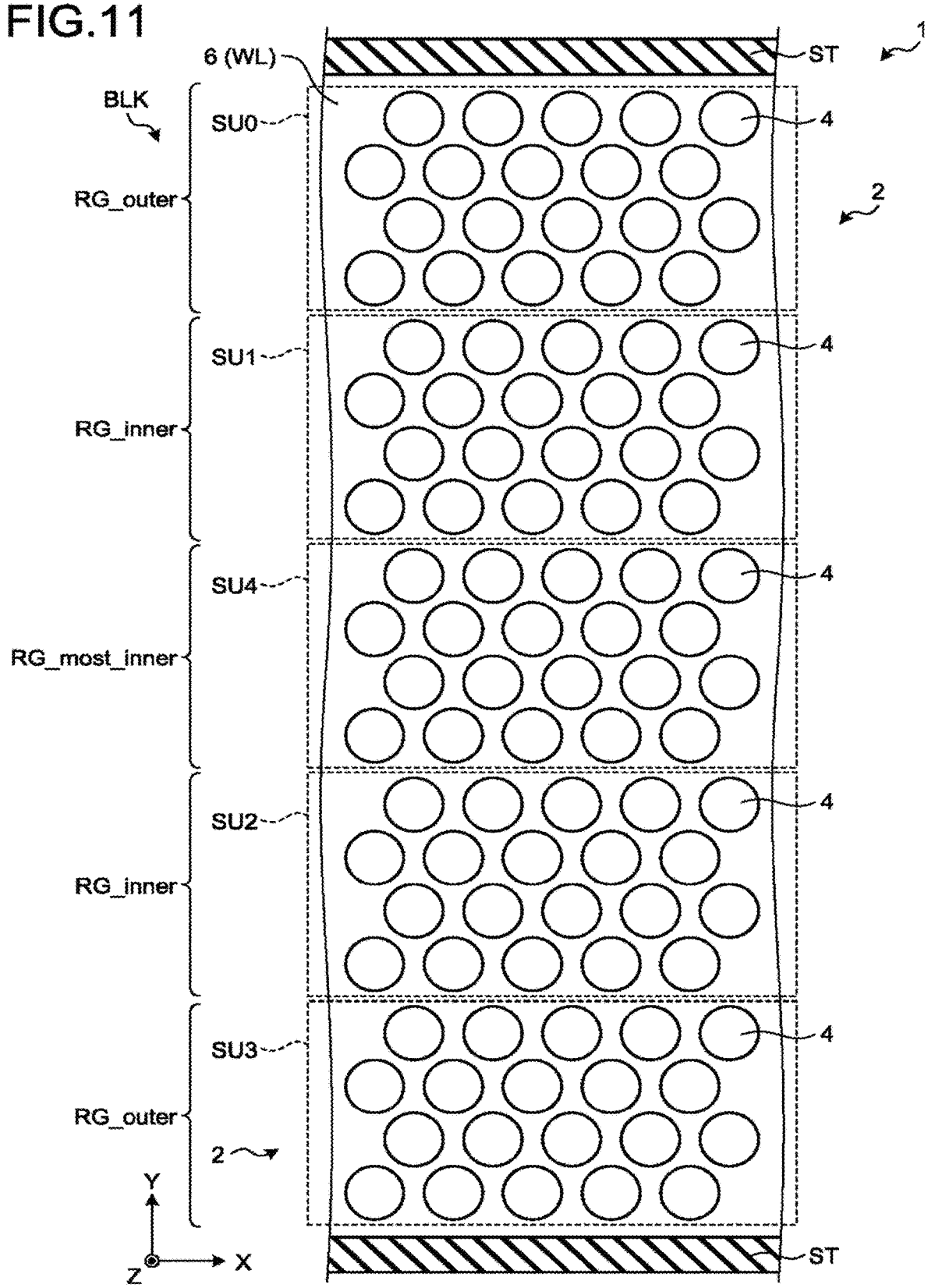

|  | SU3 (OUTER STRING UNIT) | SU2 (INNER STRING UNIT) | SU4 (INNERMOST STRING UNIT) | SU1 (INNER STRING UNIT) | SU0 (OUTER STRING UNIT) |
|---|---|---|---|---|---|
| UUR | $\Delta V_{WS}=0$ | $\Delta V_{WS}=\alpha 1$ ($\alpha 1>0$) | $\Delta V_{WS}=\beta 1$ ($\beta 1>\alpha 1, \beta 1>0$) | $\Delta V_{WS}=\alpha 1$ ($\alpha 1>0$) | $\Delta V_{WS}=0$ |
| ULR | $\Delta V_{WS}=0$ | $\Delta V_{WS}=\alpha 2$ ($\alpha 2<\alpha 1, \alpha 2>0$) | $\Delta V_{WS}=\beta 2$ ($\beta 2<\beta 1, \beta 2>0$) | $\Delta V_{WS}=\alpha 2$ ($\alpha 2<\alpha 1, \alpha 2>0$) | $\Delta V_{WS}=0$ |
| LUR | $\Delta V_{WS}=0$ | $\Delta V_{WS}=\alpha 3$ ($\alpha 3<\alpha 2, \alpha 3>0$) | $\Delta V_{WS}=\beta 3$ ($\beta 3<\beta 2, \beta 3>0$) | $\Delta V_{WS}=\alpha 3$ ($\alpha 3<\alpha 2, \alpha 3>0$) | $\Delta V_{WS}=0$ |
| LLR | $\Delta V_{WS}=0$ | $\Delta V_{WS}=\alpha 4$ ($\alpha 4<\alpha 3, \alpha 4>0$) | $\Delta V_{WS}=\beta 4$ ($\beta 4<\beta 3, \beta 4>0$) | $\Delta V_{WS}=\alpha 4$ ($\alpha 4<\alpha 3, \alpha 4>0$) | $\Delta V_{WS}=0$ |

FIG.17

| APPLIED VOLTAGE | AT TIME OF ERASE OPERATION OF INNER STRING UNITS | AT TIME OF ERASE OPERATION OF OUTER STRING UNITS |
|---|---|---|
| $V_{SL}$, $V_{BL}$ (CHANNEL APPLICATION VOLTAGE) | $V_{ERA1}$ (EXAMPLE: 20 V) | $V_{ERA2}$ (< $V_{ERA1}$) (EXAMPLE: 18 V) |
| $V_{SGD1}$, $V_{SGD2}$ (SGD DRIVING VOLTAGE OF INNER STRING UNITS) | $V_{SL1}$ (EXAMPLE: 5 V) | $V_{US1}$ (EXAMPLE: 10 V) |
| $V_{SGD0}$, $V_{SGD3}$ (SGD DRIVING VOLTAGE OF OUTER STRING UNITS) | $V_{US1}$ (EXAMPLE: 10 V) | $V_{SL1}$ (EXAMPLE: 5 V) |
| $V_{SGS}$ (SGS DRIVING VOLTAGE) | $V_{US2}$ (EXAMPLE: 20 V) | $V_{US2}$ (EXAMPLE: 20 V) |
| $V_{WL0}$ TO $V_{WL63}$ (WORD LINE VOLTAGE) | $V_{ERA\_WL}$ (EXAMPLE: 0.5 V) | $V_{ERA\_WL}$ (EXAMPLE: 0.5 V) |

| APPLIED VOLTAGE | AT TIME OF SIMULTANEOUS ERASE OPERATION OF INNER STRING UNITS AND OUTER STRING UNITS |
|---|---|
| $V_{SL}, V_{BL}$ (CHANNEL APPLICATION VOLTAGE) | $V_{ERA1}$ (EXAMPLE: 20 V) |
| $V_{SGD1}, V_{SGD2}$ (SGD DRIVING VOLTAGE OF INNER STRING UNITS) | $V_{SL3}$ ($< V_{SL1}$) (EXAMPLE: 3 V) |
| $V_{SGD0}, V_{SGD3}$ (SGD DRIVING VOLTAGE OF OUTER STRING UNITS) | $V_{SL1}$ (EXAMPLE: 5 V) |
| $V_{SGS}$ (SGS DRIVING VOLTAGE) | $V_{US2}'$ (EXAMPLE: 10 V) |
| $V_{WL0}$ TO $V_{WL63}$ (WORD LINE VOLTAGE) | $V_{ERA\_WL}$ (EXAMPLE: 0.5 V) |

SEMICONDUCTOR STORAGE DEVICE

CROSS-REFERENCE TO RELATED APPLICATIONS

This application is based upon and claims the benefit of priority from Japanese Patent Application No. 2019-050497, filed on Mar. 18, 2019; the entire contents of which are incorporated herein by reference.

FIELD

Embodiments described herein relate generally to a semiconductor storage device.

BACKGROUND

A semiconductor storage device with a three-dimensional structure in which a pillar-shaped semiconductor channel penetrates a stacked body obtained by stacking a plurality of conductive layers, the semiconductor storage device causing each conductive layer and a part close to the semiconductor channel to function as a memory cell, is known. In this semiconductor storage device, there are inconsistencies in the thickness of oxide film constituting the memory cell, and the like, according to the position in the three-dimensional structure, and such inconsistencies have affected operating speeds and reliability, and so forth.

BRIEF DESCRIPTION OF THE DRAWINGS

FIG. 7 is a diagram illustrating configuration values of initial write voltages for the memory cell array included in the semiconductor storage device according to the first embodiment;

FIG. 8 is a diagram illustrating correction values of initial write voltages for the memory cell array included in the semiconductor storage device according to the first embodiment;

FIG. 11 is a plan view illustrating details of a memory cell array that is included in a modified example of the semiconductor storage device according to the first embodiment;

FIG. 12 is a diagram illustrating correction values of initial write voltages for the memory cell array included in the modified example of the semiconductor storage device according to the first embodiment;

FIG. 17 is a diagram illustrating voltages applied at the time of an erase operation with respect to a memory cell array included in a semiconductor storage device according to a third embodiment;

FIG. 19 is a diagram illustrating voltages applied at the time of an erase operation with respect to a memory cell array included in a modified example of the semiconductor storage device according to the third embodiment.

DETAILED DESCRIPTION

Figure 1:
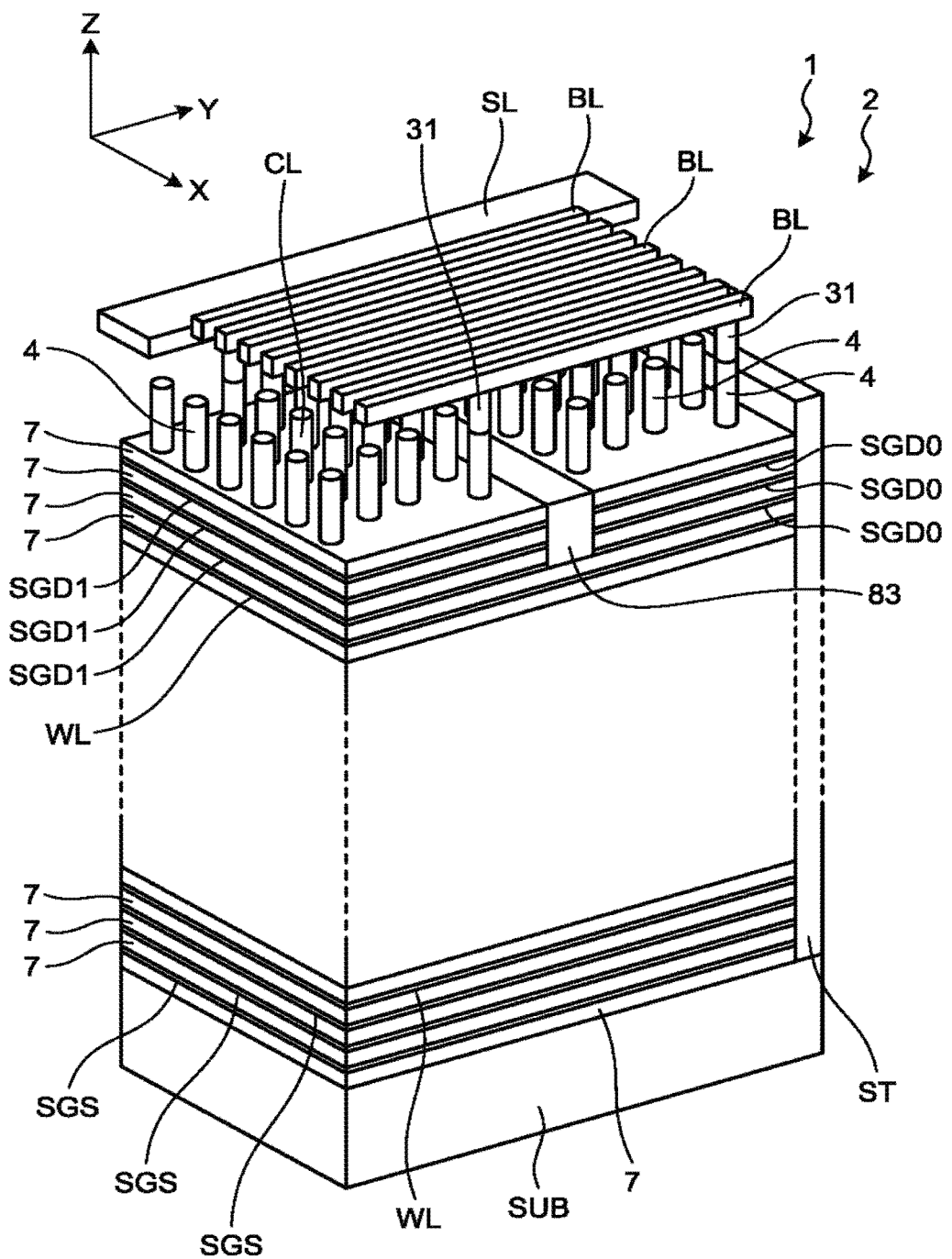
FIG. 1 is a perspective view illustrating a configuration of a semiconductor storage device according to a first embodiment.

In general, according to one embodiment, there is provided a semiconductor storage device including a plurality of first conductive layers, a second conductive layer, a plurality of first division films, a plurality of second division films, a first semiconductor pillar, a second semiconductor pillar, a first charge storage layer, a second charge storage layer, and a peripheral circuit. The plurality of first conductive layers are stacked in a first direction. The second conductive layer is disposed in the first direction with respect to the plurality of first conductive layers. The plurality of first division films divide the plurality of first conductive layers and the second conductive layer in a second direction intersecting the first direction. The plurality of first division films extend in the first direction and in a third direction intersecting the first direction and the second direction. The plurality of second division films divide, in the second direction, a region between adjoining first division films, in the second conductive layer. The plurality of second division films extend in the first direction and the third direction. The first semiconductor pillar extends in the first direction within a first region arranged between adjoining second division films, in the first conductive layer. The second semiconductor pillar extends in the first direction within a second region arranged between adjoining first division films and second division films, in the first conductive layer. The first charge storage layer is disposed between the first semiconductor pillar and the first region. The second charge storage layer is disposed between the second semiconductor pillar and the second region. The peripheral circuit supplies a first voltage to the second region when supplying a select potential to a region corresponding to the second region, in the second conductive layer. The peripheral circuit supplies a second voltage higher than the first voltage to the first region when supplying a select potential to a region corresponding to the first region, in the second conductive layer.

Exemplary embodiments of the semiconductor storage device will be explained below with reference to the accompanying drawings. The same numbers have been assigned to identical parts in the drawings, a detailed description thereof being suitably omitted, and different parts are explained. It should be noted that the drawings are schematic or conceptual and that the relationships between the thicknesses and widths of each part, as well as the size ratios between the parts, are not necessarily the same as those of actual parts. Furthermore, even when identical parts are shown, the dimensions and proportions may sometimes be represented differently depending on the drawing.

First Embodiment

FIG. 1 is a perspective view schematically illustrating a configuration of a memory cell array 2 of a semiconductor storage device 1 according to a first embodiment. The semiconductor storage device 1 is a NAND-type nonvolatile storage device that includes three-dimensionally arranged memory cells.

In the following description, mutually orthogonal directions in a plane parallel to a surface of a semiconductor substrate SUB are taken to be an X direction and a Y direction, and, more specifically, the X direction is a direction of extension of word lines WL, and the Y direction is a direction of extension of bit lines BL. A Z direction is a direction orthogonal to the semiconductor substrate SUB. Hence, the Z direction is orthogonal to the X direction and Y direction.

As illustrated in FIG. 1, the semiconductor storage device 1 includes select gates SGS, word lines WL, and select gates SGD. The select gates SGS are stacked on the semiconductor substrate SUB via interlayer insulating films 7. In the example in FIG. 1, the select gates SGS are provided in three layers. The word lines WL are stacked on the uppermost select gate SGS via the interlayer insulating films 7. In the example in FIG. 1, the word lines WL are provided in eight layers. The foregoing means a plurality of segmented select gates are included in the same layer. In the example of FIG. 1, select gates SGD0 and SGD1, which have been segmented in the Y direction, are illustrated. The select gates SGD are stacked, via the interlayer insulating films 7, on the uppermost word line WL. The select gates SGS, word lines WL, and select gates SGD are each in the form of plates that extend in the X direction and Y direction.

In the example of FIG. 1, the select gates SGD, word lines WL, and select gates SGS are divided and isolated in the Y direction by slits ST. The slits ST are provided in the semiconductor substrate SUB and extend in the X direction and Z direction.

The select gates SGD are divided in the Y direction by an insulating layer 83, for example. The insulating layer 83 is provided above (on a +Z side of) the word lines WL, and extends in the Y direction and Z direction. Therefore, the select gates SGD0 and select gates SGD1 are arranged side by side in the Y direction on the word lines WL. In the example in FIG. 1, the select gates SGD0 and SGD1 are each provided in three layers.

The semiconductor substrate SUB is a silicon substrate, for example. The select gates SGS, word lines WL, and select gates SGD are metal layers that contain tungsten (W), for example. The interlayer insulating films 7 and insulating layers 83 are insulators that contain silicon oxide, for example.

The semiconductor storage device 1 further includes a plurality of pillar-shaped bodies 4. The pillar-shaped bodies 4 penetrate the select gates SGS, word lines WL, and select gates SGD and extend in the Z direction which is the stacking direction thereof. The semiconductor storage device 1 further includes a plurality of bit lines BL and a source line SL which are provided above the select gates SGD.

The pillar-shaped bodies 4 are each electrically connected to the bit lines BL via a contact plug 31. For example, one of the pillar-shaped bodies 4 that share the select gate SGD0 and one of the pillar-shaped bodies 4 that share the select gate SGD1 are electrically connected to one bit line BL.

Note that, to simplify the illustration in FIG. 1, the interlayer insulating films provided between the select gates SGD and bit lines BL have been omitted. In addition, in the first embodiment, four select gates are provided between adjoining slits ST as the select gates SGD. Hence, a select gate SGD3 and a select gate SGD4 may be further arranged via the insulating layer 83 on a −X side of the select gates SGDA in FIG. 1.

In the case of a semiconductor storage device (memory) having a three-dimensional structure as per the semiconductor storage device 1, parts where the word lines WL and pillar-shaped bodies 4 intersect are configured to function as memory cells, and a memory cell array 2, in which a plurality of memory cells are three-dimensionally arranged, is configured. Furthermore, parts where the select gates SGS and pillar-shaped bodies 4 intersect function as source-side select gates, and parts where the select gates SGD0 and SGD1 and the pillar-shaped bodies 4 intersect are drain-side select gates. In the semiconductor storage device 1, the storage capacity can be increased by increasing the number of stacked word lines WL in a stacked body, even without using more refined patterning technology.

Figure 2:
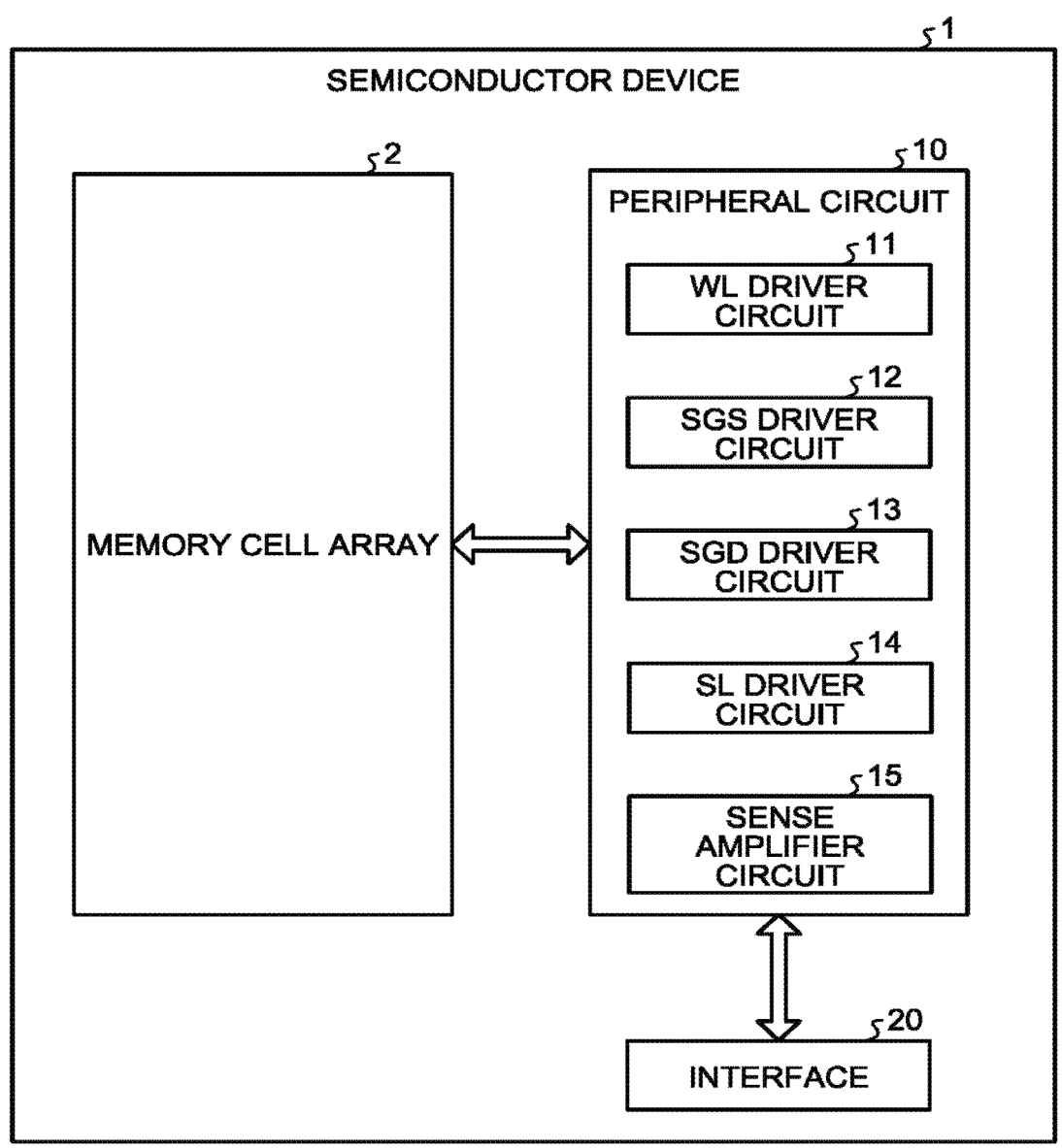
FIG. 2 is a block diagram illustrating a configuration of the semiconductor storage device according to the first embodiment.

FIG. 2 is a block diagram illustrating a configuration of the semiconductor storage device 1.

As illustrated in FIG. 2, the semiconductor storage device 1 includes a memory cell array 2, a peripheral circuit 10, and an interface 20 source line. The peripheral circuit 10 includes a WL driver circuit 11, an SGS driver circuit 12, an SGD driver circuit 13, an SL driver circuit 14, and a sense amplifier circuit 15.

The WL driver circuit 11 is a circuit that controls voltages applied to the word lines WL, and the SGS driver circuit 12 is a circuit that controls voltages applied to the select gates SGS. The SGD driver circuit 13 is a circuit that controls voltages applied to the select gates SGD, and the SL driver circuit 14 is a circuit that controls voltages applied to source lines SL. The sense amplifier circuit 15 is a circuit that determines data that has been read according to a signal from a selected memory cell.

The peripheral circuit 10 controls the operation of the semiconductor storage device 1 based on instructions input from the outside (a memory controller of a memory system adopted by the semiconductor storage device 1, for example) via the interface 20. For example, when the peripheral circuit 10 has received a write instruction, the peripheral circuit 10 selects a memory cell, at an address for which writing has been instructed, by means of the SGS driver circuit 12, SGD driver circuit 13, and WL driver circuit 11, and applies and writes a voltage corresponding to data to the selected memory cell with reference to the Vpgm management information. In addition, when the peripheral circuit 10 has received a read instruction, the peripheral circuit 10 determines, by means of the sense amplifier circuit 15, data that has been read according to a signal from the memory cell at the instructed address in the memory cell array 2, and outputs the data to the outside (memory controller) via the interface 20.

Figure 3:
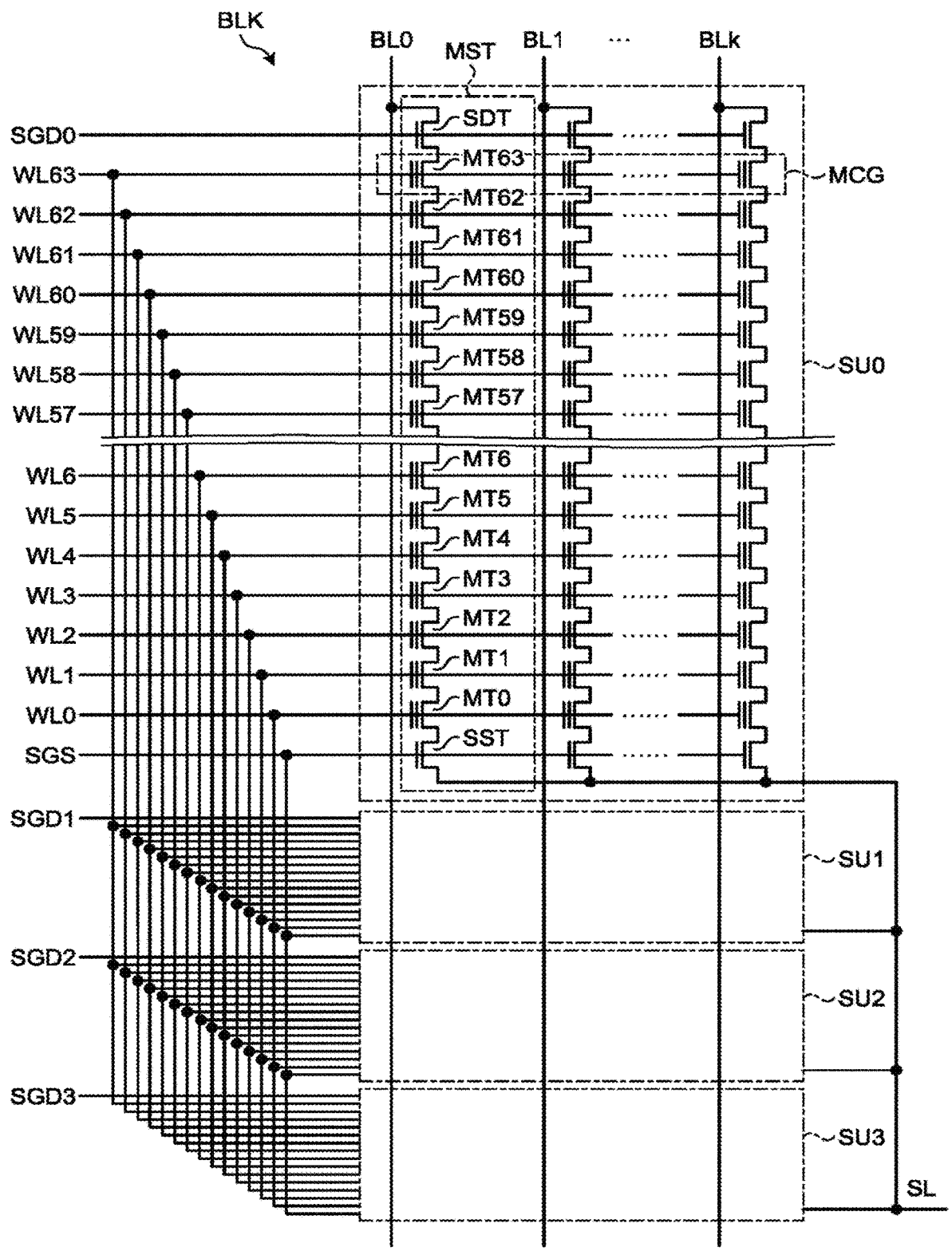
FIG. 3 is a circuit diagram illustrating a configuration of a memory cell array that is included in the semiconductor storage device according to the first embodiment.

A configuration of the memory cell array 2 will be explained next using FIG. 3. FIG. 3 is a circuit diagram illustrating a circuit configuration of the memory cell array 2.

The memory cell array 2 includes a plurality of blocks BLK, each of which is a set of a plurality of memory cell transistors MT. Each block BLK includes a plurality of string units SU0, SU1, SU2, and SU3 which are sets of the memory cell transistors MT that are associated with word lines and bit lines. The string units SU0 to SU3 each include a plurality of memory strings MST to which the memory cell transistors MT are connected in series. Note that the number of memory strings MST in the string units SU0 to SU3 is optional.

The plurality of string units SU0, SU1, SU2, and SU3 correspond to a plurality of select gates SGD0, SGD1, SGD3, and SGD4 and share select gates SGS, and function as a plurality of drive units in a block BLK0. The string units SU can each be driven by the corresponding select gates SGD and select gates SGS. Furthermore, the string units SU each include a plurality of memory strings MST.

The memory strings MST each include sixty-four memory cell transistors MT (MT0 to MT63), and selection transistors SDT and SST, for example. The memory cell transistors MT include a control gate and a charge storage layer, and hold data in a nonvolatile state. Furthermore, the sixty-four memory cell transistors MT (MT0 to MT63) are connected in series between the source of the selection transistor SDT and the drain of the selection transistor SST. Note that the number of memory cell transistors MT in a memory string MST is not limited to sixty-four.

The gates of the selection transistors SDT in each of the string units SU0 to SU3 are connected to the respective select gates SGD. However, the gates of the selection transistors SST in each of the string units SU are commonly connected to the select gate SGS, for example.

The drains of the selection transistors SDT of each memory string MST in each string unit SU are connected to different, respective bit lines BL0 to BLk (k is any integer of 2 or more). Furthermore, the bit lines BL0 to BLk commonly connect one memory string MST in each string unit SU, between a plurality of blocks BLK. In addition, the sources of each of the selection transistors SST are commonly connected to the source line SL.

That is, the string units SU are sets of memory strings MST that are connected to different bit lines BL0 to BLk and connected to the same select gate SGD. Furthermore, each block BLK is a set of plural string units SU0 to SU3 with a common word line WL. Further, the memory cell array 2 is a set of plural blocks BLK with common bit lines BL0 to BLk.

Note that, when a group of memory cell transistors MT with a common word line WL is called a "memory cell group MCG", the memory cell group MCG is the smallest unit of a set of memory cells to which predetermined voltages (a write voltage and a read voltage, for example) can be applied together via the word line WL.

Figure 4:
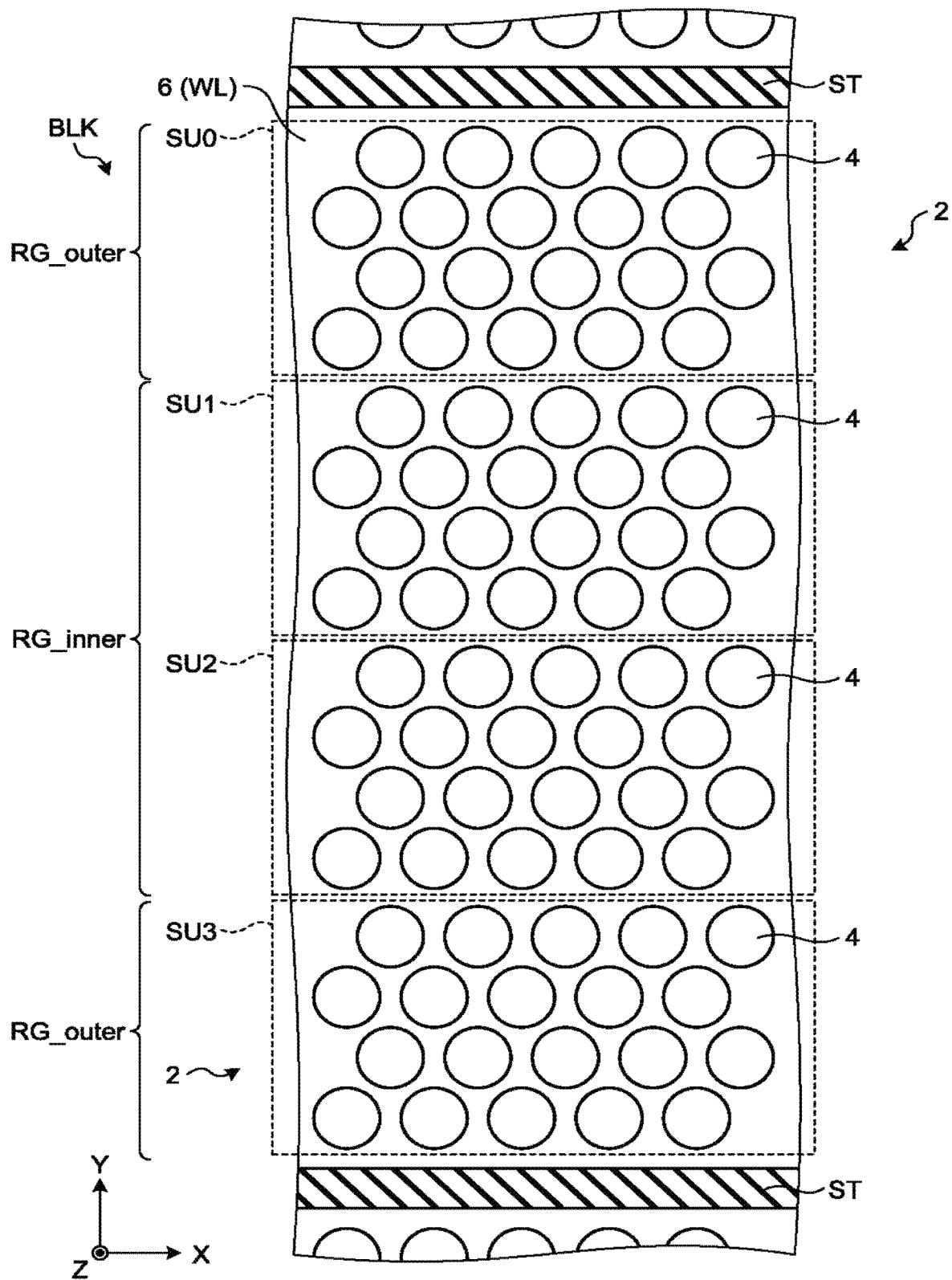
FIG. 4 is a plan view illustrating details of the memory cell array included in the semiconductor storage device according to the first embodiment.
Figure 5:
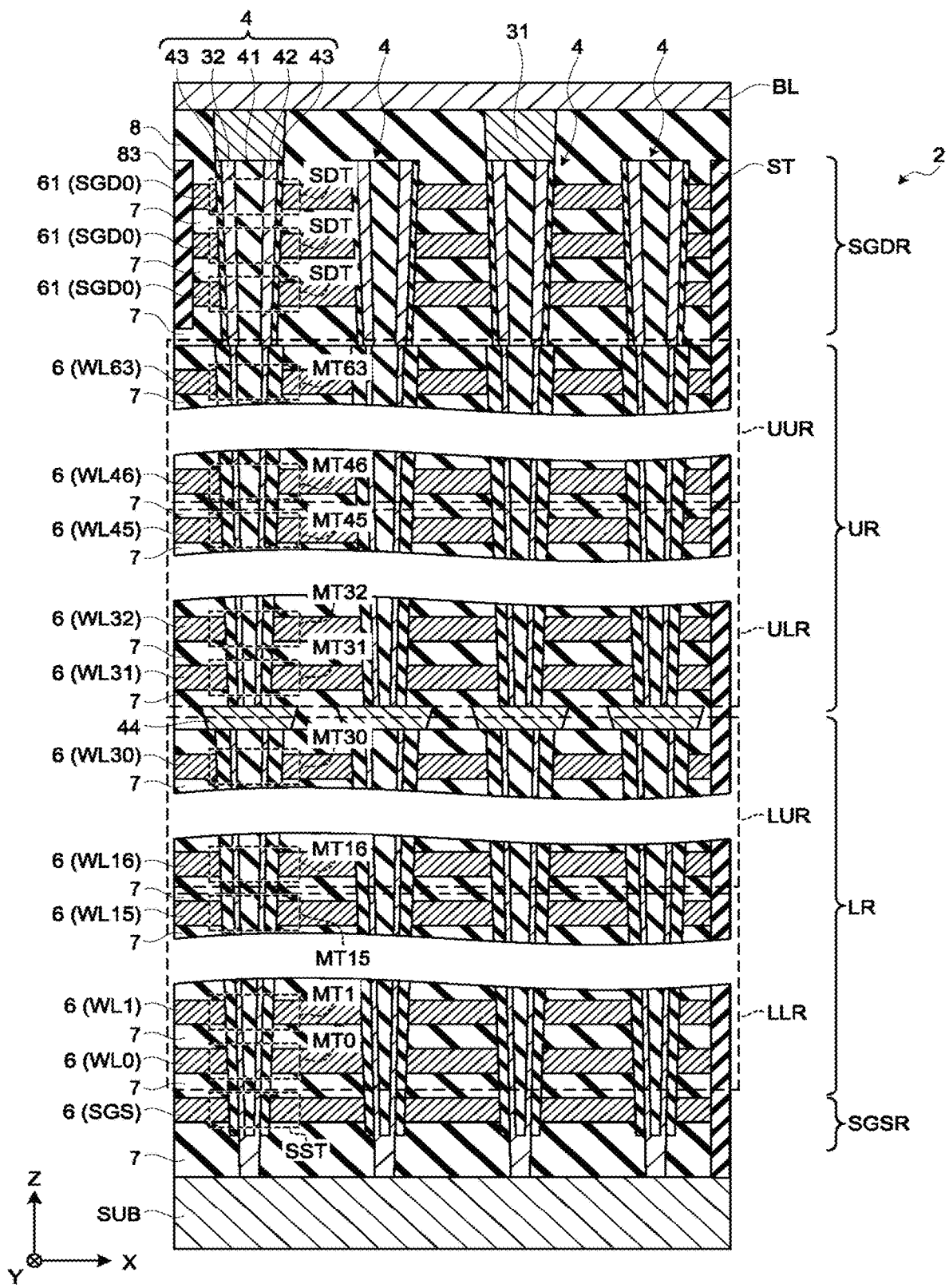
FIG. 5 is a cross-sectional view illustrating details of the memory cell array included in the semiconductor storage device according to the first embodiment.
Figure 6:
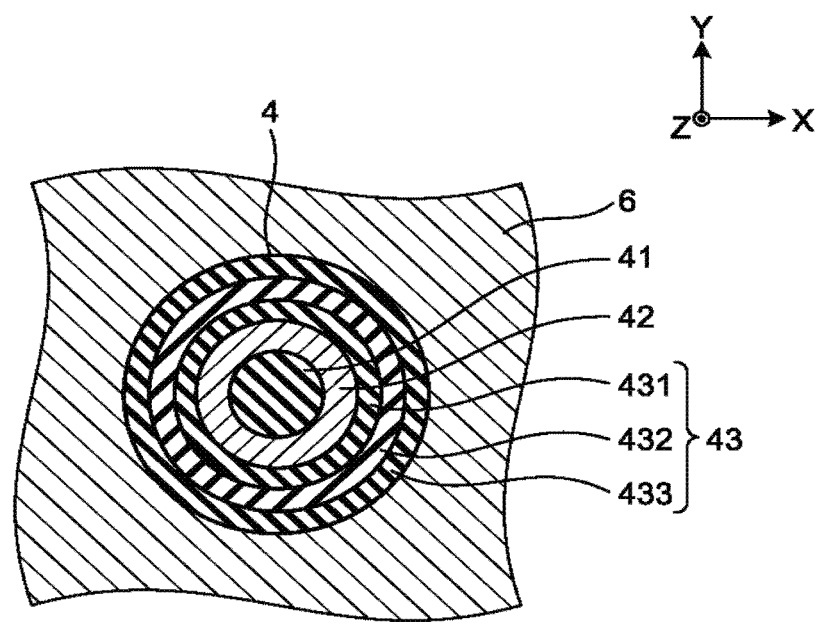
FIG. 6 is a plan view illustrating a configuration of a memory cell array included in the semiconductor storage device according to the first embodiment.

A specific configuration of the memory cell array 2 will be explained next using FIGS. 4 to 6. FIG. 4 is an XY plan view illustrating details of the memory cell array 2 included in the semiconductor storage device 1 according to the first embodiment. FIG. 5 is an ZX cross-sectional view illustrating details of the memory cell array 2 included in the semiconductor storage device 1 according to the first embodiment. FIG. 6 is an XY plan view illustrating a configuration of the memory cell array 2 included in the semiconductor storage device 1 according to the first embodiment.

As illustrated in FIGS. 4 and 5, the memory cell array 2 is configured as a three-dimensional memory cell arrangement in which, on the +Z side of the semiconductor substrate SUB, pillar-shaped bodies 4 are arranged two-dimensionally in an XY direction and word lines WL of a plurality of layers are penetrated by the pillar-shaped bodies 4.

As illustrated in FIG. 4, in an XY plan view, the plurality of pillar-shaped bodies 4 are arranged to constitute sixteen rows (sixteen lanes), for example. Each row (each lane) extends in an X direction. For rows (lanes) neighboring each other in a Y direction among the sixteen rows, the arrangement positions of the pillar-shaped bodies 4 are shifted relative to one another by approximately half an arrangement pitch in the X direction. In an XY plan view, the plurality of pillar-shaped bodies 4 can also be regarded as being arranged in a zigzag shape. The pillar-shaped bodies 4 each correspond to the plurality of memory transistors MT0 to MT63 arranged in a Z direction. That is, a three-dimensional arrangement of a plurality of memory transistors MT and an arrangement of a plurality of selection transistors SDT are configured by an arrangement, in the XY direction, of a plurality of pillar-shaped bodies 4 and an arrangement, in the Z direction, of the memory transistors MT corresponding to each of the pillar-shaped bodies 4.

Among the three-dimensionally arranged plurality of memory transistors MT, a plurality of memory transistors MT that constitute sixteen rows (sixteen lanes) with approximately the same Z coordinates share a conductive layer 6 constituting a word line WL63, for example, and can be supplied with an identical control voltage (write voltage) from the peripheral circuit 10.

In addition, the plurality of selection transistors SDT are arranged on a +Z side of the plurality of memory transistors MT0 to MT63, and are grouped in four-row (four-lane) units. In other words, each of the conductive layers constituting the select gates SGD is segmented (divided) into a plurality of driving electrode films 61 to 64 by an approximately plate-like (approximately fin-shaped) insulating film (second division film) 83 that extends in an XZ direction. Among the two- or three-dimensionally arranged plurality of selection transistors SDT, four rows (four lanes) of selection transistors SDT with approximately the same Z coordinate share a driving electrode film that constitutes the select gate SGD, for example, and are supplied with an identical control voltage (driving voltage) from the peripheral circuit 10.

Accordingly, the arrangements of plural memory transistors MT are grouped as the string units SU0 to SU3 in four-row (four-lane) units. That is, the string units SU0 to SU3 each function as units driven by the driving electrode films 61 to 64 in block BLK0. In other words, the string units SU0 to SU3 each include four rows (four lanes) of selection transistors SDT, four rows (four lanes) of memory transistors MT0 to MT63, and four rows (four lanes) of selection transistors SST (see FIG. 3).

Among the plurality of string units SU0 to SU3 in the memory cell array 2, the string units SU0 and SU3, which are a short distance from the slits ST, are called outer string units SU0 and SU3, and the string units SU1 and SU2, which are a long distance from the slits ST, are called inner string units SU1 and SU2. The outer string units SU0 and SU3 can also be regarded as string units that contact the slits ST, and the inner string units SU1 and SU2 can also be seen as string units that do not contact the slits ST. Note that regions including the outer string units SU0 and SU3 may also be called outer regions RG_outer, and regions including the inner string units SU1 and SU2 may also be called inner regions RG_inner.

In the memory cell array 2, conductive layers 6 and insulating layers 7 are repeatedly and alternately stacked, and the driving electrode films 61 to 64 and insulating layers 7 are repeatedly and alternately stacked. The conductive layers 6 can each be formed of a material whose main component is a conductor (a metal such as tungsten, for example). The insulating layers 7 can each be formed of a material whose main component is an insulator (a semiconductor oxide such as silicon oxide, for example). The conductive layers 6 function as word lines WL. The driving electrode films 61 to 64 can each be formed of a material whose main component is a conductor (a metal such as tungsten, for example). The driving electrode film 61 functions as the select gate SGD0, the driving electrode film 62 functions as the select gate SGD1, the driving electrode film 63 functions as the select gate SGD2, and the driving electrode film 64 functions as the select gate SGD.

In addition, in the memory cell array 2, a pillar-shaped portion 4 includes a core insulating film 41, a semiconductor channel 42, and an insulating film 43. The core insulating film 41 can be formed of a material whose main component is an insulator (silicon oxide, for example). The semiconductor channel 42 is disposed to surround the core insulating film 41 from the outside and has an approximately cylindrical shape that extends along a core axis of the pillar-shaped body 4.

The semiconductor channel 42 includes a channel region (active region) in a memory string MS, and can be formed of a material whose main component is a semiconductor that does not contain substantial impurities (polysilicon, for example).

The insulating film 43 is disposed between the driving electrode films 61 to 64 or the conductive layer 6 (word lines WL), and the semiconductor channel 42, and surrounds the semiconductor channel 42 in a plan view. The insulating film 43 covers a side face of the semiconductor channel 42. The insulating film 43 is configured to have a charge storage capability in a part disposed between the conductive layer 6 (word line WL) and the semiconductor channel 42. As illustrated in FIG. 6, the insulating film 43 can be configured by a three-layered structure having a tunnel insulating film 431, a charge storage film 432, and a block insulating film 433, in that order starting on the semiconductor channel 42 side. The tunnel insulating film 431 can be formed of a material whose main component is an oxide (silicon oxide, for example). The charge storage film 432 can be formed of a material whose main component is a nitride (silicon nitride, for example). The block insulating film 433 can be formed of a material whose main component is an oxide (silicon oxide, a metal oxide, or silicon oxide and a metal oxide stacked, for example). That is, the insulating film 43 may have an ONO-type three-layered structure in which a charge storage film is held between the pair of insulating films (the tunnel insulating film and block insulating film) in the part disposed between the conductive layer 6 (word line WL) and the semiconductor channel 42. In addition, the insulating film 43 may be configured by a single-layer structure of a gate insulating film, in a part disposed between the driving electrode films 61 to 64 and the semiconductor channel 42. The gate insulating film can be formed of a material whose main component is an oxide (silicon oxide, for example).

Furthermore, in the memory cell array 2, the pillar-shaped bodies 4 may be configured by stacking a plurality of pillar-shaped structures (also called tiers) via a semiconductor film 44. In FIG. 5, a case where the pillar-shaped bodies 4 are configured by two tiers is illustrated as an example. The semiconductor film 44 is electrically connected to the respective semiconductor channels 42 of upper and lower tiers. The memory cell array 2 includes regions UR and LR that correspond to the two tiers and which are obtained through segmentation in the Z direction. Region UR is a region that corresponds to a higher tier, and region LR is a region that corresponds to a lower tier. Region UR is a region on the +Z side of region LR. Note that, if the region corresponding to the selection transistor SDT is called region SGDR and the region corresponding to the selection transistor SST is called region SGSR, region SGDR is disposed on the +Z side of region UR, and region SGSR is disposed on the −Z side of region LR.

Region UR may be further segmented into a predetermined number (two, for example) in the Z direction and can be segmented into a region UUR and a region ULR. Region UUR is a region on the +Z side of region ULR. Region LR may be further segmented into a predetermined number (two, for example) in the Z direction and can be segmented into a region LUR and a region LLR. Region LUR is a region on the +Z side of region LLR. That is, region LLR, region LUR, region ULR, and region UUR are arranged in order of increasing height from the substrate SB, in each of the string units SU0 to SU3. Region LLR corresponds to word lines WL0 to WL15, and corresponds to memory cells MT0 to MT15. Region LUR corresponds to word lines WL16 to WL30, and corresponds to memory cells MT16 to MT30. Region ULR corresponds to word lines WL31 to WL45, and corresponds to memory cells MT31 to MT45. Region UUR corresponds to word lines WL46 to WL61, and corresponds to memory cells MT46 to MT61.

Figure 10:
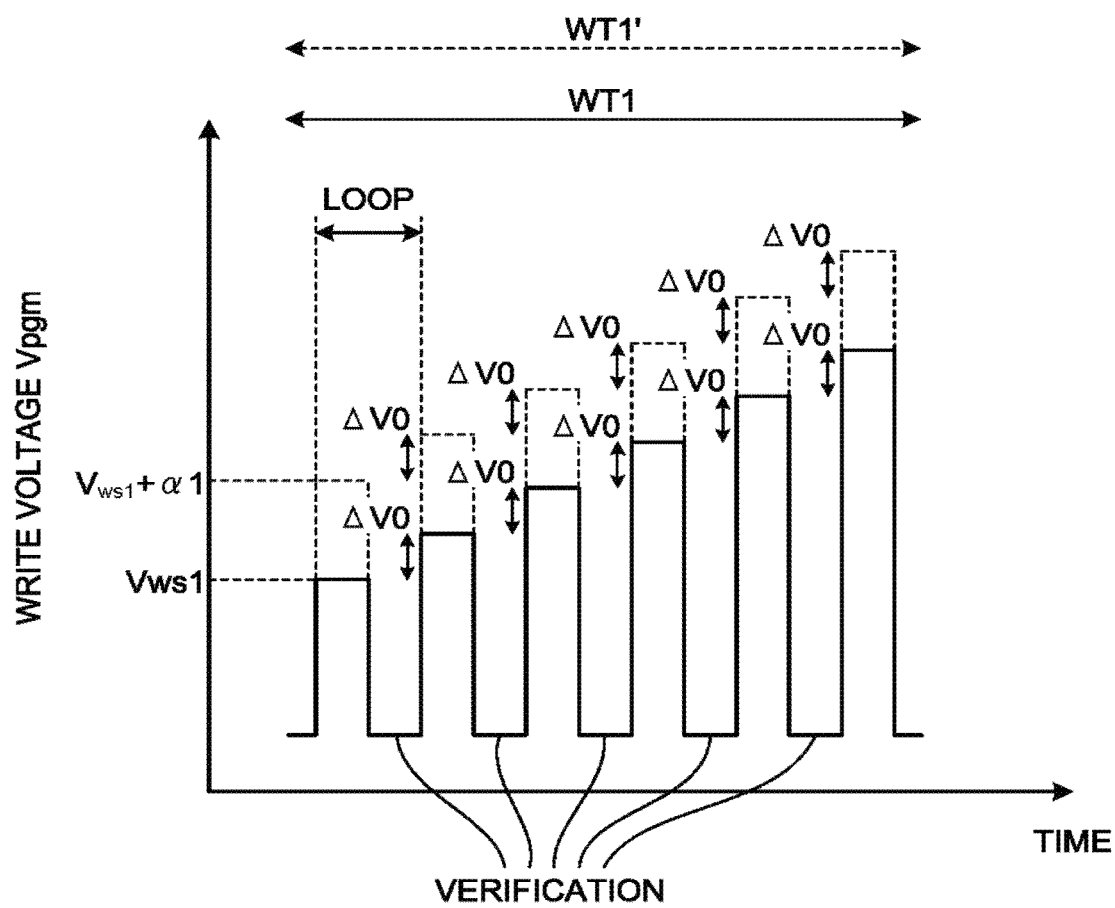
FIG. 10 is a diagram to illustrate an operation for step-up writing to the memory cell array included in the semiconductor storage device according to the first embodiment.

A process of writing to each memory cell MT can be performed by means of an incremental step pulse program (ISPP) in which a write operation and a verification operation are repeated alternately, while increasing the write voltage, until a verification ok is obtained (see FIG. 10). In the write process, the number of loops during writing can vary according to the value of an initial write voltage, and a write time WT can vary accordingly. To reduce inconsistencies in the write time WT between each of the memory cells MT in the memory cell array 2, changing the initial write voltage according to the ease of writing to each memory cell MT is effective.

From that perspective, Vpgm management information 2b1 stored in a ROM region of the memory cell array 2 includes configuration information that associates general physical locations of the memory cells MT, which are divisible into word line WL units, with configuration values Vws of initial write voltages, as illustrated in FIG. 7. FIG. 7 is a diagram illustrating configuration values Vws of initial write voltages. The configuration information illustrated in FIG. 7 includes block identification information (block numbers, for example) and region identification information (information indicating any of region LLR, region LUR, region ULR, and region UUR which are obtained through segmentation in the Z direction, for example) as general physical locations of the memory cells MT that are divisible into word line WL units, and includes configuration values corresponding to the physical locations as the configuration values Vws of the initial write voltages. The configuration values Vws of initial write voltages corresponding to the general physical locations of the memory cells MT can be grasped by referencing the configuration information illustrated in FIG. 7. For example, it can be grasped that the configuration value of the initial write voltage corresponding to the memory cells MT that belong to region UUR of block BLK0 is Vws=Vws1.

Meanwhile, the film thickness of the insulating film 43 in the inner string units SU1 and SU2 is relatively thick in comparison with the outer string units SU0 and SU3 illustrated in FIG. 4 due to the process (for example, the substantial time period that the insulating film 43 illustrated in FIG. 5 is exposed to etchant when the sacrificial film is removed through wet etching is shorter in the inner string units than in the outer string units). Accordingly, in comparison with the outer string units SU0 and SU3, information is not readily written to the inner string units SU1 and SU2 when an identical write voltage has been applied thereto.

However, correction information 2b2 stored in the ROM region of the memory cell array 2 includes correction information that associates Y positions of the memory cells MT with correction values ΔVws of the initial write voltages, as illustrated in FIG. 8. For example, the correction information illustrated in FIG. 8 includes string unit identification information (for example, information indicating any of the string unit SU0, string unit SU1, string unit SU2, and string unit SU3 arranged in the Y direction) as information indicating the Y positions of the memory cells MT, that is, the string units to which the memory cells MT belong. The correction information includes region identification information (information indicating any of region UUR, region ULR, region LUR, and region LLR which are arranged in the Z direction, for example) as information indicating the Z positions of the memory cells MT, that is, the regions to which the memory cells MT belong. The correction information includes, as the correction values ΔVws of the initial write voltages, correction values that correspond to the string units and regions to which the memory cells MT belong. The correction values ΔVws of the initial write voltages corresponding to the Y positions of the memory cells MT (the memory strings to which the memory cells MT belong are any of SU0 to SU3) can be grasped by referencing the correction information.

For example, upon referencing the correction information illustrated in FIG. 8 for different Y positions, it can be grasped that the correction value of the initial write voltage Vws for the memory cells MT that belong to the outer string unit SU0 and region UUR is ΔVws=0, and that the correction value of the initial write voltage Vws for the memory cells MT that belong to the inner string unit SU1 and region UUR is ΔVws=α1 (>0).

That is, by executing control using the correction information illustrated in FIG. 8, the correction value ΔVws for the inner string units SU1 and SU2 at the start of writing can be made higher than the correction value ΔVws for the outer string units SU0 and SU3 at the start of writing.

In addition, the difference in the film thickness of the insulating film 43 between the outer string units and inner string units in the lower region LR is relatively small in comparison with the upper region UR of a stacked body LMB due to the process (for example, the time period difference, between the inner and outer string units, in the substantial time period that the insulating film 43 is exposed to etchant when the sacrificial film is removed through wet etching is shorter in the lower region than in the upper region).

More precisely, the difference in the film thickness of the insulating film 43 between the outer string units and inner string units in the lower region ULR is relatively small in comparison with the upper region UUR in region UR.

Similarly, the difference in the film thickness of the insulating film 43 between the outer string units and inner string units in the lower region LLR is relatively small in comparison with the upper region LUR in region LR.

However, correction information 2b2 stored in the ROM region of the memory cell array 2 includes correction information that associates Z positions of memory cells MT with correction values ΔVws of the initial write voltages, as illustrated in FIG. 8. The correction values ΔVws of the initial write voltages corresponding to the Z positions of the memory cells MT (the regions to which the memory cells MT belong are any of regions UUR to LLR which are arranged in the Z direction) can be grasped by referencing the correction information.

For example, upon referencing the correction information illustrated in FIG. 8 for different Z positions, it can be grasped that the correction value of the initial write voltage Vws for the memory cells MT that belong to the inner string unit SU1 and region UUR is ΔVws=α1. It can be grasped that the correction value of the initial write voltage Vws for the memory cells MT that belong to the inner string unit SU1 and region ULR is ΔVws=α2 (<α1). It can be grasped that the correction value of the initial write voltage Vws for the memory cells MT that belong to the inner string unit SU1 and region LUR is αVws=α3 (<α2). It can be grasped that the correction value of the initial write voltage Vws for the memory cells MT that belong to the inner string unit SU1 and region LUR is ΔVws=α4 (<α3).

That is, by executing control using the correction information illustrated in FIG. 8, the correction value ΔVws for the lower region at the start of writing can be made smaller than the correction value ΔVws for the upper region at the start of writing.

The peripheral circuit 10 can perform correction of the initial write voltage by using the correction value ΔVws as illustrated in FIG. 8. If the configuration value of the initial write voltage is Vws and the correction value is ΔVws, the peripheral circuit 10 applies a write voltage Vpgm, denoted by the following formula 1, to the memory cells MT at the start of writing.

$$Vpgm = Vws + \Delta Vws \qquad \text{Formula 1}$$

For example, upon receiving an instruction to write to memory cells MT that belong to region UUR and belong to the outer string units SU0 and SU3 from the outside (the memory controller), the peripheral circuit 10 references the configuration information illustrated in FIG. 7 and specifies the configuration value Vws=Vws1 of the initial write voltage, and references the correction information illustrated in FIG. 8 and specifies the correction value ΔVws=0 of the initial write voltage. The peripheral circuit 10 determines the write voltage Vpgm=Vws1 by means of formula 1 and notifies the WL driver circuit 11.

Figure 9A:
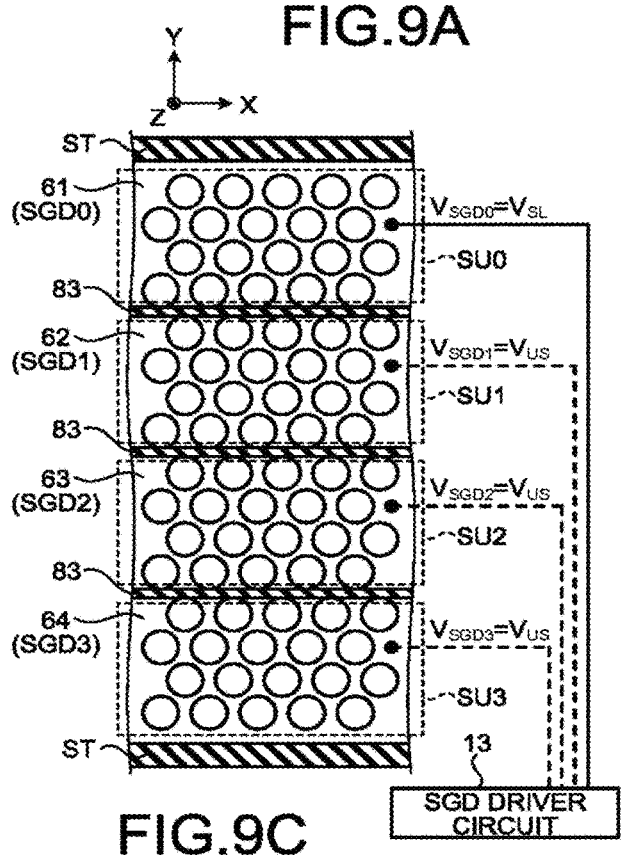
FIGS. 9A to 9D are diagrams to illustrate a process for writing to the memory cell array included in the semiconductor storage device according to the first embodiment.

Further, as illustrated in FIG. 9A, the SGD driver circuit 13 applies a driving voltage $V_{SGD0}$ with a select potential $V_{SL}$ to the driving electrode film 61, and applies driving voltages $V_{SGD1}$, $V_{SGD2}$, and $V_{SGD3}$ with a nonselect potential $V_{US}$ to the driving electrode films 62, 63, and 64, respectively. FIGS. 9A to 9D are diagrams to illustrate a process for writing to the memory cell array 2 included in the semiconductor storage device 1 according to the first embodiment. Accordingly, the selection transistor SDT of the outer string unit SU0 turns on and the potential of each semiconductor channel 42 is configured at a potential corresponding to the select potential $V_{SL}$, and the selection transistors SDT of the inner string units SU1 and SU2 and the outer string unit SU3 turn off such that each semiconductor channel 42 assumes a floating state.

Figure 9B:
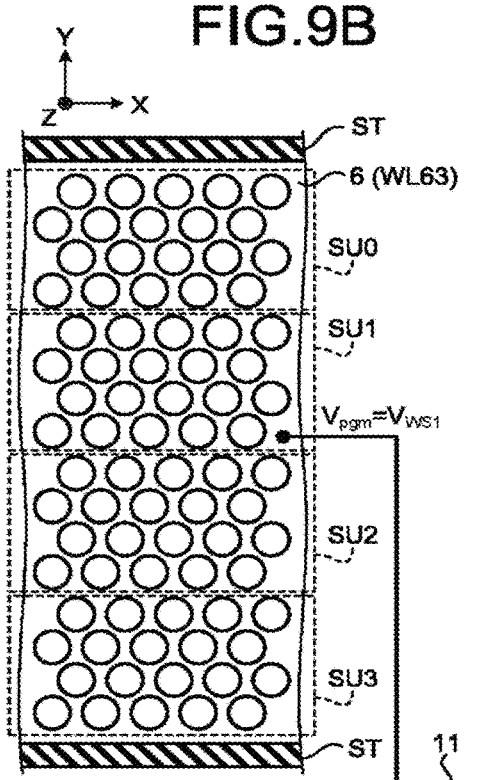

Moreover, as illustrated in FIG. 9B, the WL driver circuit 11 applies a write voltage Vpgm=Vws1 to the conductive layer 6 constituting the word line WL (word line WL63, for example) that corresponds to the address instructed by the write instruction. FIGS. 9A and 9B are diagrams illustrating voltages applied at the time of a write process with respect to the outer string unit SU0, an active control line being denoted by a solid line and inactive control lines being denoted by broken lines. The region corresponding to the word line WL63 in the memory cell array 2 is region UUR (see FIG. 5). Accordingly, a write voltage Vpgm=Vws1 is applied at the start of writing to memory cells MT that belong to region UUR and belong to the outer string unit SU0. Furthermore, the peripheral circuit 10 alternately repeats a write operation by means of the WL driver circuit 11 and a verification operation by means of the sense amplifier circuit 15, while increasing the write voltage using a step width ΔV0, until a verification ok is obtained. As a result, as denoted by the bold line in FIG. 10, a write process to the memory cells MT that belong to region UUR and belong to the outer string unit SU0 can be completed in a write time period WT1. FIG. 10 is a diagram to illustrate an operation for step-up writing to the memory cell array 2 included in the semiconductor storage device 1 according to the first embodiment.

Thereupon, in the nonselected inner string units SU1 and SU2 and the nonselected outer string unit SU3, as a result of coupling between the semiconductor channel 42 in a floating state and the conductive layers 6 constituting the word lines WL, information is not written to the memory cells MT because the potential of the semiconductor channel 42 is able to rise to a burst potential in response to the application of the write voltages.

Furthermore, upon receiving an instruction to write to memory cells MT that belong to region UUR and belong to the inner string units SU1 and SU2 from the outside (the memory controller), for example, the peripheral circuit 10 references the configuration information illustrated in FIG. 7 and specifies the configuration value Vws=Vws1 of the initial write voltage, and references the correction information illustrated in FIG. 8 and specifies the correction value ΔVws=α1 of the initial write voltage. The peripheral circuit 10 determines the write voltage Vpgm=Vws1+α1 by means of formula 1 and notifies the WL driver circuit 11.

Figure 9C:
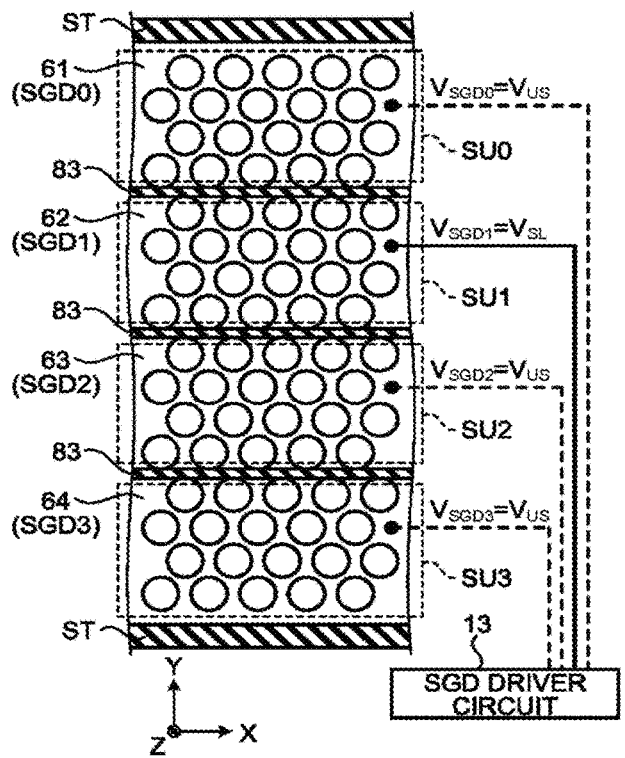

Further, as illustrated in FIG. 9C, the SGD driver circuit 13 applies driving voltages $V_{SGD1}$ and $V_{SGD2}$ with a select potential $V_{SL}$ to the driving electrode films 62 and 63, respectively, and applies driving voltages $VS_{GD0}$ and $V_{SGD3}$ with a nonselect potential $V_{US}$ to the driving electrode films 61 and 64, respectively. Accordingly, the selection transistors SDT of the inner string units SU1 and SU2 turn on and the potential of each semiconductor channel 42 is configured at a potential corresponding to the select potential $V_{SL}$, and the selection transistors SDT of the outer string units SU0 and SU3 turn off such that each semiconductor channel 42 assumes a floating state.

Figure 9D:
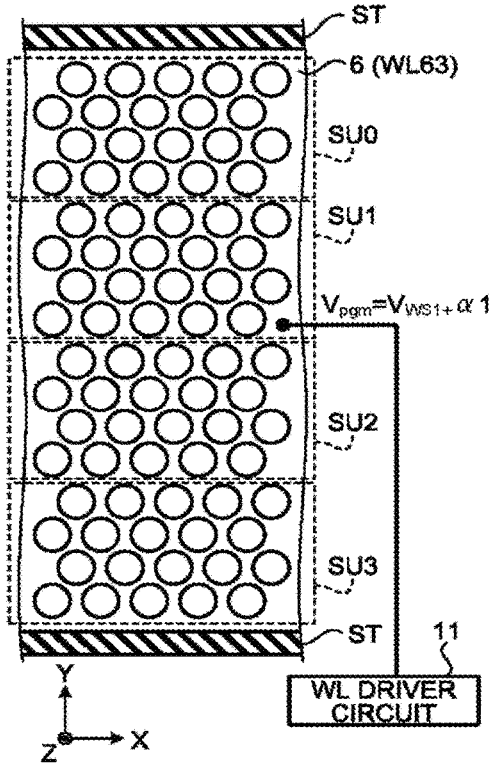

Moreover, as illustrated in FIG. 9D, the WL driver circuit 11 applies a write voltage Vpgm=Vws1+α1 to the conductive layer 6 constituting the word line WL (word line WL63, for example) that corresponds to the address instructed by the write instruction. FIGS. 9C and 9D are diagrams illustrating the voltages applied at the time of a write process to the inner string unit SU1. The region corresponding to the word line WL63 in the memory cell array 2 is region UUR (see FIG. 5). Accordingly, a write voltage Vpgm=Vws1+α1 is applied at the start of writing to memory cells MT that belong to region UUR and belong to the inner string unit SU1. Furthermore, the peripheral circuit 10 alternately repeats a write operation by means of the WL driver circuit 11 and a verification operation by means of the sense amplifier circuit 16, while increasing the write voltage using a step width ΔV0, until a verification ok is obtained. As a result, as denoted by the broken line in FIG. 10, a write process to the memory cells MT that belong to region UUR and belong to the inner string unit SU1 can be completed in a write time period WT1' (≈WT1).

Thereupon, in the nonselected outer string units SU0 and SU3 and the nonselected inner string unit SU2, as a result of coupling between the semiconductor channel 42 in a floating state and the conductive layers 6 constituting the word lines WL, information is not written to the memory cells MT because the potential of the semiconductor channel 42 is able to rise to a burst potential in response to the application of the write voltages.

As illustrated in FIG. 10, by making the write voltage Vpgm that is applied to the memory cells MT of the inner string units SU1 and SU2 at the start of writing higher than the write voltage Vpgm that is applied to the memory cells MT of the outer string units SU0 and SU3 at the start of writing, the number of loops during the write process can be made uniform for the outer string units SU0 and SU3 and inner string units SU1 and SU2, and the respective write times WT can be made to approximately coincide with one another.

As described hereinabove, according to the first embodiment, in the semiconductor storage device 1, the peripheral circuit 10 applies a higher write voltage Vpgm when writing information to the memory cells MT of the inner string units SU1 and SU2 than when writing information to the memory cells MT of the outer string units SU0 and SU3 in the memory cell array 2. Accordingly, because the write speed between a plurality of memory cells MT can be matched to memory cells with a high write speed, the overall write performance of the semiconductor storage device 1 can be improved.

For example, in comparison with the inner string units SU0 and SU3 which are close to the slits ST in the memory cell array 2, the film thickness of the insulating film 43 in the outer string units SU1 and SU2, which are far from the slits ST, is relatively thick, and information is not readily written when an identical write voltage has been applied.

However, the peripheral circuit 10 causes a higher write voltage to be applied from the WL driver circuit 11 when writing information to the memory cells MT of the inner string units SU1 and SU2 than when writing information to the memory cells MT of the outer string units SU0 and SU3. Accordingly, because the write speed between a plurality of memory cells MT can be matched to memory cells MT with a high write speed, the overall write performance of the semiconductor storage device 1 can be improved.

Note that the correction value of the initial write voltage may be changed in multiple stages. For example, as a modified example of the first embodiment, in the semiconductor storage device 1, the plurality of pillar-shaped bodies 4 are arranged to constitute twenty rows (twenty lanes), for example, in an XY plan view, as illustrated in FIG. 11. FIG. 11 is an XY plan view illustrating details of a memory cell array 2 that is included in the modified example of the semiconductor storage device 1 according to the first embodiment. The memory cell array 2 illustrated in FIG. 11 is configured by adding a string unit SU4 between the string unit SU1 and the string unit SU2 which are illustrated in FIG. 4. Note that regions including the outer string units SU0 and SU3 may also be called outer regions RG_outer, regions including the inner string units SU1 and SU2 may also be called inner regions RG_inner, and a region including an innermost string unit SU4 may also be called the innermost region RG_most_inner.

Accordingly, correction information 2b2 stored in the ROM region of the memory cell array 2 includes correction information that associates, in multiple stages, Y positions of memory cells MT with correction values ΔVws of initial write voltages, as illustrated in FIG. 12. Upon referencing the correction information for different Y positions, it is possible to grasp the correction values ΔVws of initial write voltages that correspond to the Y positions of the memory cells MT. For example, when looking at the outer SU0 and SU3, then the inner SU1 and SU2, and then the innermost SU4, it can be grasped that the correction value ΔVws of the initial write voltage Vws rises in multiple stages: "0"→"α1 (>0)"→"β1 (>α1>0)".

That is, by executing control using the correction information 2b2 illustrated in FIG. 12, the correction value ΔVws for the inner string units SU1 and SU2 at the start of writing can be made higher than the correction value ΔVws for the outer string units SU0 and SU3 at the start of writing. Furthermore, by executing control using the correction information illustrated in FIG. 12, the correction value ΔVws for the innermost string unit SU4 at the start of writing can be made higher than the correction value ΔVws for the inner string units SU1 and SU2 at the start of writing.

In addition, the correction information 2b2 includes correction information that associates Z positions of the memory cells MT (regions to which the memory cells MT belong are any of regions UUR to LLR which are arranged in the Z direction) with correction values ΔVws of the initial write voltages, as illustrated in FIG. 12. Upon referencing the correction information for different Z positions, it can be grasped that, for the innermost SU4, the correction value ΔVws of the initial write voltage for the memory cells MT that belong to region UUR=β1 (>0), that the correction value ΔVws of the initial write voltage for the memory cells MT that belong to region ULR=β2 (<β1, >0), that the correction value ΔVws of the initial write voltage for the memory cells MT that belong to region LUR=β3 (<β2, >0), and that the correction value ΔVws of the initial write voltage for the memory cells MT that belong to region LLR=β4 (<β3, >0), for example.

That is, by executing control using the correction information 2b2 illustrated in FIG. 12, for the innermost string unit SU4, for example, the correction value ΔVws for the lower region at the start of writing can be made smaller than the correction value ΔVws for the upper region at the start of writing.

In addition, in the present modified example, as illustrated in FIGS. 13A to 13F, a driving electrode film 65 (select gate SGD5) has been added to the memory cell array 2 between the driving electrode film 62 (select gate SGD1) and the driving electrode film 63 (select gate SGD3). FIGS. 13A to 13F are diagrams to illustrate a process for writing to the memory cell array 2 included in the modified example of the semiconductor storage device 1 according to the first embodiment.

Figure 13A:
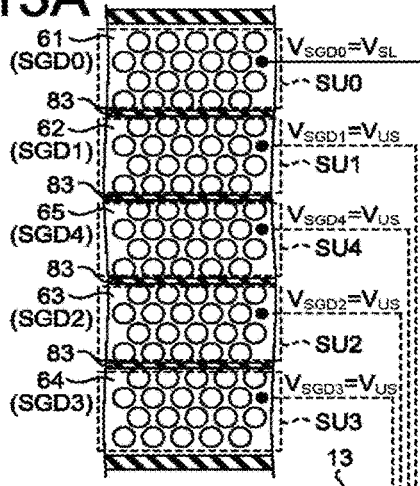
FIGS. 13A to 13F are diagrams to illustrate writing to the memory cell array included in the modified example of the semiconductor storage device according to the first embodiment.
Figure 13B:
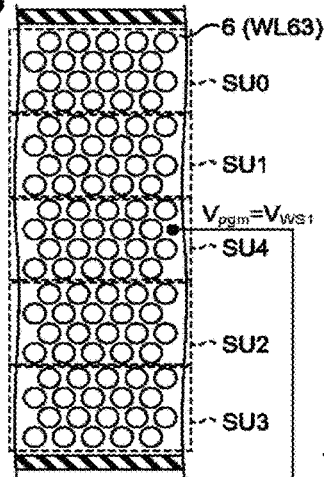

For example, as illustrated in FIGS. 13A and 13B, a write process to the memory cells MT that belong to region UUR (which corresponds to the word line WL63) and belong to the outer string unit SU0 is performed in the same way as the write process illustrated by FIGS. 9A and 9B of the first embodiment.

Figure 13C:
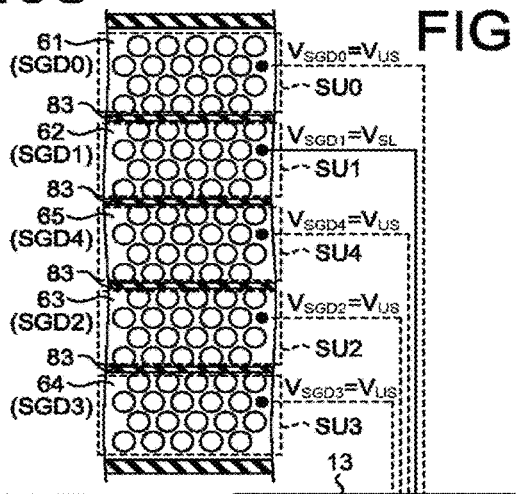
Figure 13D:
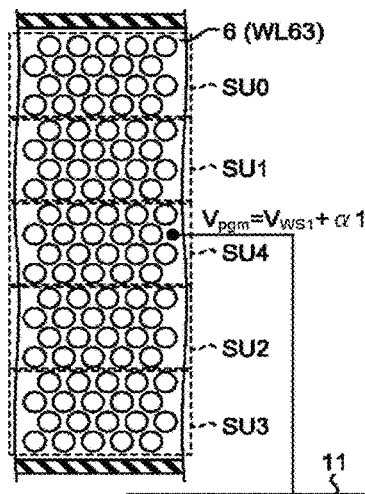

In addition, for example, as illustrated in FIGS. 13C and 13D, a write process to the memory cells MT that belong to region UUR (which corresponds to the word line WL63) and belong to the inner string unit SU1 is performed in the same way as the write process illustrated by FIGS. 9C and 9D of the first embodiment.

Furthermore, a write process to the memory cells MT that belong to region UUR and belong to the innermost string unit SU4 is performed as follows. Upon receiving a write instruction from the outside (the memory controller), the peripheral circuit 10 references the configuration information illustrated in FIG. 7 and specifies the configuration value Vws=Vws1 of the initial write voltage, and references the correction information illustrated in FIG. 12 and specifies the correction value ΔVws=β1 of the initial write voltage. The peripheral circuit 10 determines the write voltage Vpgm=Vws1+β1 by means of formula 1 and notifies the WL driver circuit 11.

Figure 13E:
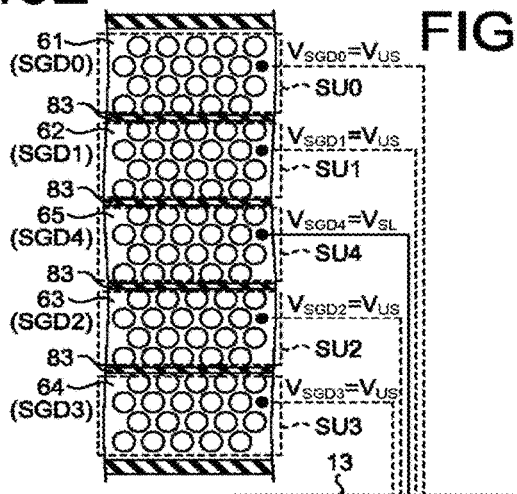

Further, as illustrated in FIG. 13E, the SGD driver circuit 13 applies a driving voltage $V_{SGD4}$ with a select potential $V_{SL}$ to the driving electrode film 65, and applies driving voltages $V_{SGD0}$, $V_{SGD1}$, $V_{SGD2}$, and $V_{SGD3}$ with a nonselect potential $V_{US}$ to the driving electrode films 61, 62, 63, and 64, respectively. Accordingly, the selection transistor SDT of the innermost string unit SU4 turns on and the potential of each semiconductor channel 42 is configured at a potential corresponding to the select potential $V_{SL}$, and the selection transistors SDT of the outer string units SU0 and SU3 and the somewhat inner string units SU1 and SU2 turn off such that each semiconductor channel 42 assumes a floating state.

Figure 13F:
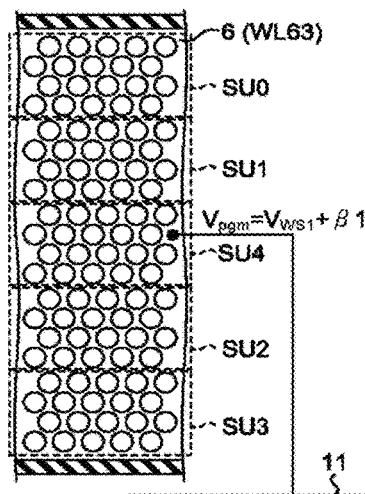

Moreover, as illustrated in FIG. 13F, the WL driver circuit 11 applies a write voltage Vpgm=Vws1+β1 to the conductive layer 6 constituting the word line WL (word line WL63, for example) that corresponds to the address instructed by the write instruction. FIGS. 13E and 13F are diagrams illustrating the voltages applied at the time of a write process to the innermost string unit SU4, an active control line being denoted by a solid line and inactive control lines being denoted by broken lines. The region corresponding to the word line WL63 in the memory cell array 2 is region UUR (see FIG. 5). Accordingly, a write voltage Vpgm=Vws1+β1 is applied at the start of writing to memory cells MT that belong to region UUR and belong to the innermost string unit SU4. Furthermore, the peripheral circuit 10 alternately repeats a write operation by means of the WL driver circuit 11 and a verification operation by means of the sense amplifier circuit 16, while increasing the write voltage using a step width ΔV0, until a verification ok is obtained. Accordingly, a write process to the memory cells MT that belong to region UUR and belong to the innermost string unit SU4 can be completed in a time period that is approximately equal to the write time period WT1 (see FIG. 10).

Thereupon, in the nonselected outer string units SU0 and SU3 and the nonselected inner string units SU1 and SU2, as a result of coupling between the semiconductor channel 42 in a floating state and the conductive layers 6 constituting the word lines WL, information is not written to the memory cells MT because the potential of the semiconductor channel 42 is able to rise to a burst potential in response to the application of the write voltages.

Thus, the write voltage Vpgm applied to the memory cells MT of the inner string units SU1 and SU2 at the start of writing is made higher than the write voltage Vpgm applied to the memory cells MT of the outer string units SU0 and SU3 at the start of writing. Furthermore, the write voltage Vpgm applied to the memory cells MT of the innermost string unit SU4 at the start of writing is made higher than the write voltage Vpgm applied to the memory cells MT of the inner string units SU1 and SU2 at the start of writing. Accordingly, the number of loops during the write process can be made uniform for the outer string units SU0 and SU3, inner string units SU1 and SU2, and innermost string unit SU4, and the respective write time periods can be made to approximately coincide with one another. Therefore, because the write speed between a plurality of memory cells MT in the memory cell array 2 can be matched to memory cells with a high write speed, the overall write performance of the semiconductor storage device 1 can be improved.

Alternatively, when the semiconductor storage device 1 is mounted as a semiconductor chip, the correction value of the initial write voltage may vary according to the position in the semiconductor chip (that is, the position in the substrate SB). For example, the difference in the film thickness of the insulating film 43 between the inner and outer string units in an −X side region of the semiconductor chip is relatively small in comparison with a +X side region thereof due to the process (the substantial time period that the insulating film 43 is exposed to etchant when the sacrificial film is removed through wet etching is shorter in the −X side region than the +X side region of the semiconductor chip).

Figure 14:
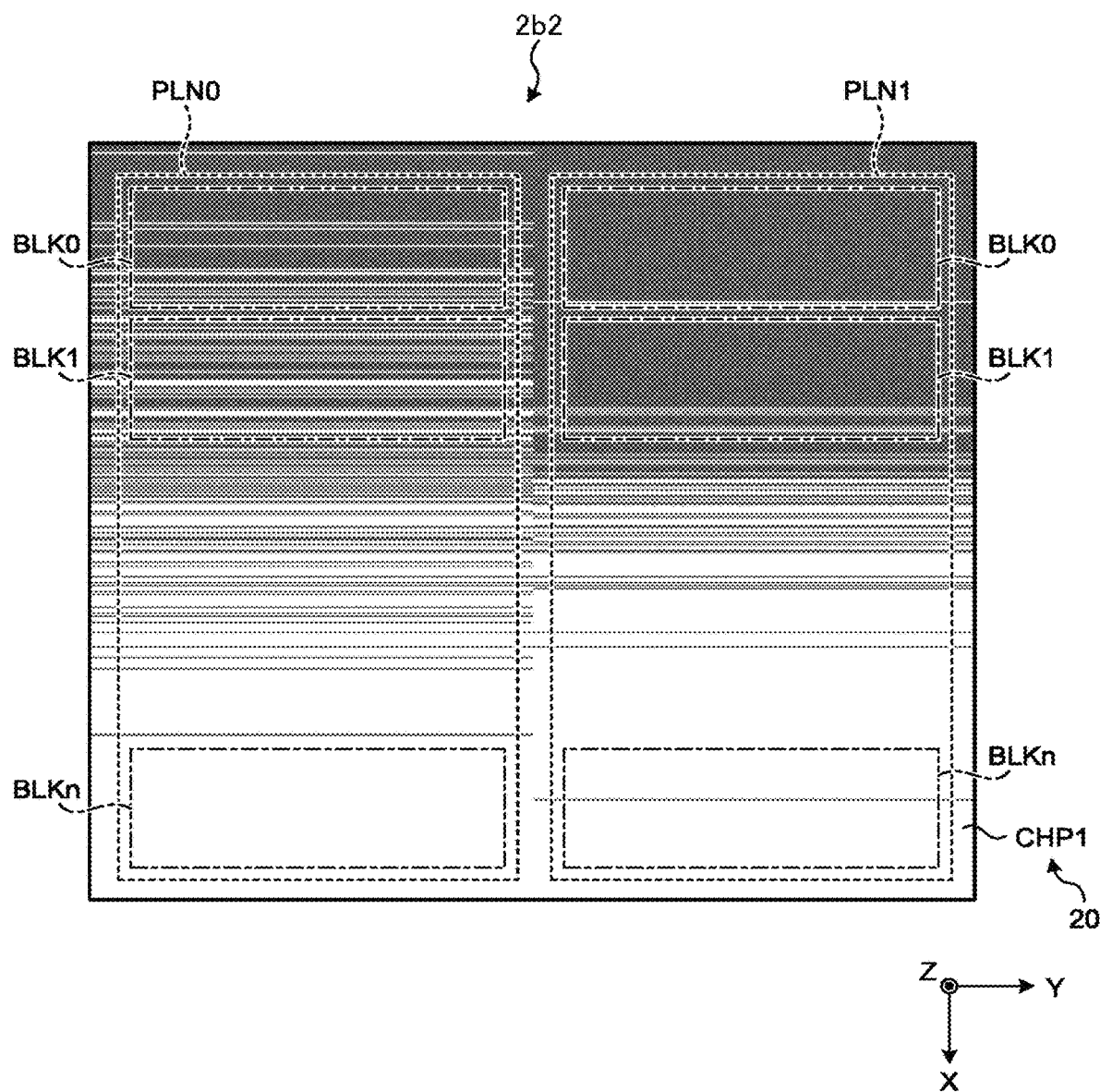
FIG. 14 is a diagram illustrating a distribution of correction values of initial write voltages for a semiconductor chip that includes the semiconductor storage device according to the first embodiment.

However, correction information 2b2 stored in the ROM region of the memory cell array 2 can include correction information that associates XY positions in a semiconductor chip CHP1 with correction values ΔVws of initial write voltages, as illustrated in FIG. 14. FIG. 14 is a diagram illustrating a distribution of correction values of initial write voltages for a semiconductor chip that includes the semiconductor storage device according to the first embodiment; The correction information illustrated in FIG. 14 includes information indicating physical locations in the semiconductor chip CHP1 (information indicating coordinates in the semiconductor chip CHP1 or information indicating physical addresses managed by the peripheral circuit 10, for example) as XY positions of the memory cells MT, and includes correction values corresponding to the XY positions as correction values ΔVws of the initial write voltage. In FIG. 14, the value of the correction value ΔVws is denoted by the depth of color (line density), and the fact that the value of the correction value ΔVws becomes smaller as the color depth increases is illustrated. By referencing the correction information illustrated in FIG. 14, the correction values ΔVws of initial write voltages that correspond to the XY positions in the semiconductor chip CHP1 of the memory cells MT can be grasped.

In addition, in the correction information illustrated in FIG. 14, physical locations of planes PLN0 and PLN1 may be mapped, and physical locations of each of the blocks BLK0 to BLKn in each of the planes PLN0 and PLN1 may be mapped. The planes PLN0 and PLN1 are each subarrays that are configured by segmenting the memory cell array 2 and are accessible in parallel within the memory cell array 2. The planes PLN0 and PLN1 each have a plurality of blocks BLK0, BLK1, . . . BLKn (where n is any integer of two or more). In this case, by referencing the correction information illustrated in FIG. 14, the correction values ΔVws of initial write voltages for each of the planes PLN0 and PLN1 can be broadly grasped, and the correction values ΔVws of initial write voltages for each of the blocks BLK0 to BLKn can be broadly grasped.

That is, by executing control using the correction information illustrated in FIG. 14, the correction values ΔVws for the inner string units can be controlled for each region in the semiconductor chip, and can be made smaller in a −X side region of the semiconductor chip than in a +X side region thereof, for example.

Alternatively, when the semiconductor storage device is mounted as a semiconductor wafer, the correction value of the initial write voltage may be varied according to the positions of the memory cells MT in the semiconductor wafer (that is, the positions of the memory cells MT in the substrate SB). For example, the difference in the film thickness of the insulating film 43 between the inner and outer string units in a region toward the periphery of the semiconductor wafer can be relatively small in comparison with a region toward the center thereof due to the process (the substantial time period that the insulating film 43 is exposed to etchant when the sacrificial film is removed through wet etching is shorter in the region toward the periphery of the semiconductor wafer than the region toward the center thereof).

However, by executing control using correction information corresponding to the position in the semiconductor wafer, the correction values ΔVws for the inner string units can be controlled for each region in the semiconductor wafer, and can be made smaller in a region toward the periphery of the semiconductor wafer than in a region toward the center thereof, for example.

Second Embodiment

A semiconductor storage device according to a second embodiment will be explained next. Parts that differ from the first embodiment will be primarily explained hereinbelow.

The first embodiment attempts to improve write performance by devising write voltages to handle the increased difference in write performance that can arise between an outer lane and an inner lane as the number of rows (lanes) in a three-dimensional memory increases.

The second embodiment attempts to improve write performance by devising a write operation order to handle the increased difference in write performance that can arise between an outer lane and an inner lane as the number of rows (lanes) in a three-dimensional memory increases.

For example, the film thickness of the insulating film 43 in the string units SU that are close to the slits ST in the memory cell array 2 is relatively thin in comparison with the string units SU that are far from the slits ST, and the string units SU that are close to the slits ST are susceptible to program disturbance. Program disturbance is a phenomenon whereby a writing state of a memory cell is defective due to stress generated during the write process.

In addition, in the plurality of string units SU0 to SU3 in the same block BLK, the driving electrode films 61 to 64 are isolated from one another (see FIG. 9A), and share the conductive layer 6 constituting the word line WL (see FIG. 9B). Therefore, each of the string units SU can be affected, even if nonselected, by the application of a voltage from the word line WL (conductive layer 6) at the time of a write operation of another string unit SU. That is, in comparison with the string units SU that are far from the slits ST (the inner string units SU), the string units SU that are close to the slits ST (the outer string units SU), in the memory cell array 2, are susceptible to program disturbance through the application of a voltage from the word line WL (conductive layer 6) in a nonselected state.

Therefore, the second embodiment attempts to mitigate program disturbance for the outer string units SU in the semiconductor storage device by performing a write operation of the outer string units SU after a write operation of the inner string units SU.

Figure 15A:
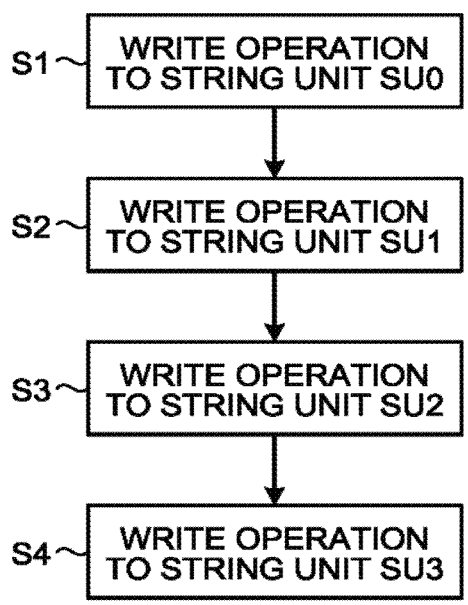
FIGS. 15A and 15B are flowcharts to illustrate write processes for a memory cell array that is included in a semiconductor storage device according to a second embodiment.

For example, the physical addresses in the blocks BLK that are illustrated in FIG. 4 are assigned in the order of the string units SU0, SU1, SU2, and SU3. When a memory controller (not illustrated) that controls the semiconductor storage device 1 receives, from a host (not illustrated), a sequential write command that includes sequential logical addresses, the memory controller converts the logical addresses to physical addresses, and issues a write instruction that includes sequential physical addresses to the semiconductor storage device 1. In the semiconductor storage device 1, when the peripheral circuit 10 has received the write instruction including sequential physical addresses for the block BLK0, the peripheral circuit 10 normally controls the writing order so that data is written in physical address order, as illustrated in FIG. 15A. Accordingly, the WL driver circuit 11 performs write operations by placing the string units SU0, SU1, SU2, and SU3 in a selected state in sequential order (that is, performs S1, S2, S3, and S4 in sequential order).

Figure 15B:
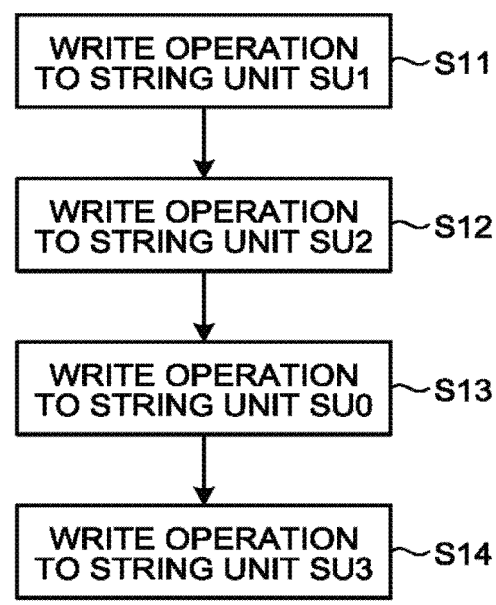

However, in the second embodiment, when the peripheral circuit 10 has received a write instruction including sequential physical addresses, the peripheral circuit 10 changes the order of the data write operations from the physical address order (in units of string units). As illustrated in FIG. 15B, the peripheral circuit 10 controls the writing order such that write processes (S13 and S14) of the outer string units SU0 and SU3 are performed after performing the write processes (S11 and S12) of the inner string units SU2 and SU3. FIGS. 15A and 15B are flowcharts to illustrate write processes for a memory cell array that is included in a semiconductor storage device according to a second embodiment; That is, the peripheral circuit 10 controls the writing order such that the process of S11 and the process of S12 are sequentially performed, and then the process of S13 and the process of S14 are sequentially performed. Accordingly, the outer string units SU0 and SU3 can be made insusceptible to program disturbance in the processes of S11 and S12, and the program disturbance of the outer string units SU0 and SU3 can be mitigated.

Note that the peripheral circuit 10 may also fixedly control the writing order. For example, prior to shipment, the writing order control information illustrated in FIG. 15B is stored in the ROM region of the memory cell array 2. The peripheral circuit 10 reads the writing order control information stored in the ROM region and configures a state machine in an initial configuration period such as during startup of the semiconductor storage device 1. The peripheral circuit 10 uses the state machine to perform writing order control. For example, when the peripheral circuit 10 has received a write instruction including sequential physical addresses for the block BLK0, the peripheral circuit 10 performs control of the writing order illustrated in FIG. 15B. The WL driver circuit 11 performs writing order control by means of the state machine and performs a write operation to each string unit using the writing order illustrated in FIG. 15B. Furthermore, the writing order control may be made different for each block, and the writing order control information may associate physical locations of blocks with writing order information.

As described hereinabove, according to the second embodiment, in the semiconductor storage device 1, the write operations of the outer string units SU0 and SU3 are performed after the write operations of the inner string units SU2 and SU3. Accordingly, the program disturbance of the outer string units SU0 and SU3 can be mitigated.

Note that the peripheral circuit 10 may further establish suitable writing order. Establishing suitable writing order means adjusting the order of the plurality of write operations to create insusceptibility to program disturbance. The act of establishing suitable writing order may also be carried out in an inspection procedure prior to shipment, or may be performed as part of an initialization operation such as during startup of the semiconductor storage device 1 after shipment. In addition, prior to shipment, writing order control information after suitable writing order has been established may be stored in the ROM region of the memory cell array 2.

For example, the peripheral circuit 10 confirms whether either the order S13→S14 or the order S14→S13 is not readily susceptible to program disturbance. The peripheral circuit 10 may also confirm the extent to which the respective orders are not susceptible to program disturbance by performing a write operation and a verification operation and comparing the number of loops for which verification ok is obtained, and so forth. When the peripheral circuit 10 has confirmed that the order S14→S13 is less readily susceptible to program disturbance than the order S13→S14, the peripheral circuit 10 changes the writing order illustrated in FIG. 15B to the order S14→S13. Accordingly, the program disturbance of the semiconductor storage device 1 can be further mitigated.

Alternatively, for example, the peripheral circuit 10 confirms whether either the order S11→S12 or the order S12→S11 is not readily susceptible to program disturbance. The peripheral circuit 10 may also confirm the extent to which the respective orders are not susceptible to program disturbance by performing a write operation and a verification operation and comparing the number of loops for which verification ok is obtained, and so forth. When the peripheral circuit 10 has confirmed that the order S12→S11 is less readily susceptible to program disturbance than the order S11→S12, the peripheral circuit 10 changes the writing order illustrated in FIG. 15B to the order S12→S11. Accordingly, the program disturbance of the semiconductor storage device 1 can be further mitigated.

Alternatively, for example, the peripheral circuit 10 confirms whether either the order S11→S12 or the order S12→S11 is not readily susceptible to program disturbance, and confirms whether either the order S13→S14 or the order S14→S13 is not readily susceptible to program disturbance. The peripheral circuit 10 may also confirm the extent to which the respective orders are not susceptible to program disturbance by performing a write operation and a verification operation and comparing the number of loops for which verification ok is obtained, and so forth. When the peripheral circuit 10 has confirmed that the order S12→S11 is less readily susceptible to program disturbance than the order S11→S12, and that the order S14→S13 is less readily susceptible to program disturbance than the order S13→S14, the peripheral circuit 10 changes the writing order illustrated in FIG. 15B to the order S12→S11→S14→S13. Accordingly, the program disturbance of the semiconductor storage device 1 can be further mitigated.

Alternatively, the control of the writing order may also be performed in multiple stages. For example, the physical addresses in the blocks BLK that are illustrated in FIG. 11 are assigned in the order of the string units SU0, SU1, US4, SU2, and SU3. When the peripheral circuit 10 has received a write instruction including sequential physical addresses for the blocks BLK, the peripheral circuit 10 changes the order of data write operations from a physical address-based order in multiple stages (in units of string units).

Figure 16A:
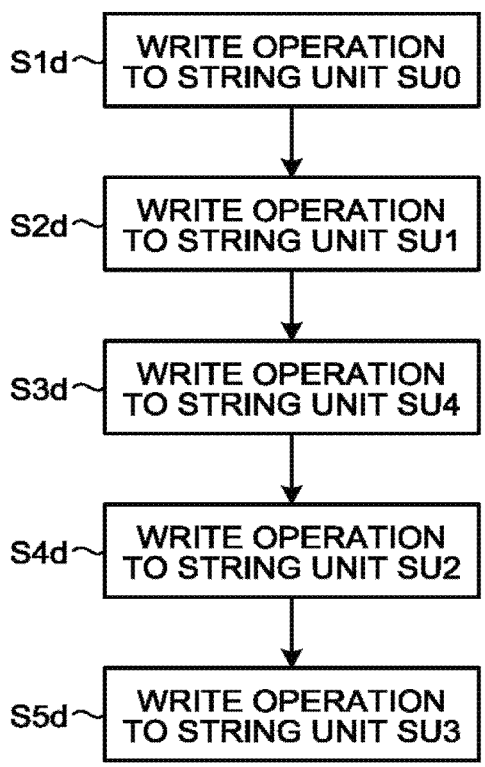
FIGS. 16A and 16B are flowcharts to illustrate write processes for a memory cell array that is included in a modified example of the semiconductor storage device according to the second embodiment.
Figure 16B:
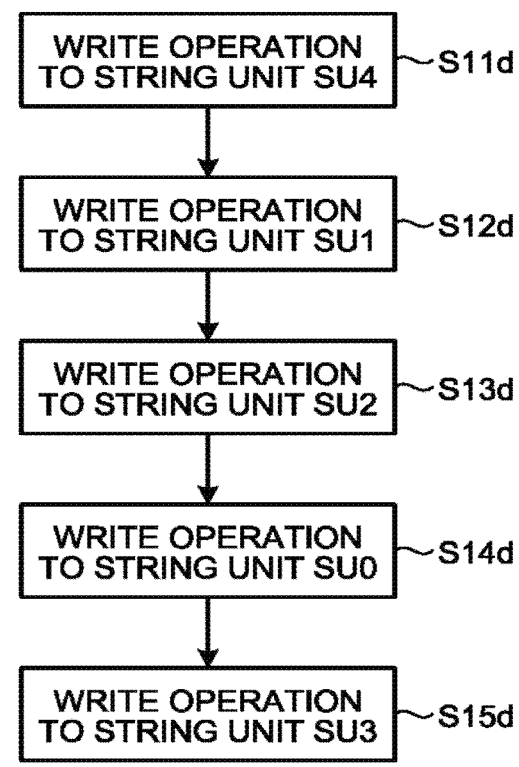

Specifically, the peripheral circuit 10 changes the writing order from the physical address-based order illustrated in FIG. 16A (S1d→S2d→S3d→S4d→S5d) to the order illustrated in FIG. 16B. As illustrated in FIG. 16B, the peripheral circuit 10 controls the writing order such that the write processes (S12d and S13d) of the inner string units SU1 and SU2 are performed after performing the write process (S11d) of the innermost string unit SU4, and such that the write processes (S14d and S15d) of the outer string units SU0 and SU3 are performed thereafter. That is, the peripheral circuit 10 controls the writing order such that the process of Sl1d, the process of S12d, and the process of S13d are sequentially performed, and then the process of S14d and the process of S15d are sequentially performed. Accordingly, the WL driver circuit 11 performs write operations in the order S11d→S12d→S13d→S14d→S15d. As a result, the outer string units SU0 and SU3 can be made insusceptible to program disturbance in the processes of S11d, S12, and S13d, and the program disturbance of the outer string units SU0 and SU3 can be mitigated.

Note that the peripheral circuit 10 may also fixedly control the writing order. For example, prior to shipment, the writing order control information illustrated in FIG. 16B is stored in the ROM region of the memory cell array 2. The peripheral circuit 10 reads the writing order control information stored in the ROM region and configures a state machine in an initial configuration period such as during startup of the semiconductor storage device 1. The peripheral circuit 10 uses the state machine to perform writing order control. For example, when the peripheral circuit 10 has received a write instruction including sequential physical addresses for the block BLK0, the peripheral circuit 10 performs control of the writing order illustrated in FIG. 16B. The WL driver circuit 11 performs writing order control by means of the state machine and performs a write operation to each string unit using the writing order illustrated in FIG. 16B. Furthermore, the writing order control may be made different for each block, and the writing order control information may associate physical locations of blocks with writing order information.

Accordingly, by performing the writing order control in multiple stages, the program disturbance of the outer string units SU0 and SU3 can be further mitigated.

Furthermore, a writing order scheme may also be devised in addition to devising write voltages to handle the increased difference in write performance that can arise between an outer lane and an inner lane as the number of rows (lanes) in a three-dimensional memory increases. That is, the write operations of the outer string units may be performed after the write operations of the inner string units, and control may be executed to make high write voltages for the inner string units higher than the write voltages for the outer string units. Accordingly, the program disturbance of the outer string units can be further mitigated, and the write speed between a plurality of memory cells MT can be matched to memory cells with a high write speed. As a result, the overall write performance of the semiconductor storage device can be improved further.

Third Embodiment

A semiconductor storage device according to a third embodiment will be explained next. Parts that differ from the first embodiment and second embodiment will be primarily explained hereinbelow.

In the first embodiment and second embodiment, schemes for improving the write performance of the semiconductor storage device are implemented.

In the third embodiment, a scheme for improving the erase performance of the semiconductor storage device is implemented.

A difference in erase performance can arise between an outer lane and an inner lane because the insulating film (block insulating film) in an inner lane grows thicker than in an outer lane as the number of rows (lanes) in a three-dimensional memory increases. That is, in comparison with the inner string units in the memory cell array 2, the film thickness of the insulating film 43 is relatively thin in the outer string units, and information is readily erased when an identical erase voltage has been applied between the control gate (word line WL) and channel region (semiconductor channel 42) of the memory cell MT. For example, erase voltages are applied all together to the same block BLK, and the erase operation is completed when a verification ok is obtained for all the blocks BLK in an erase verification operation. Here, the threshold distribution of the memory cells MT in the outer string units SU tends towards a deeper position (lower-voltage position) than the threshold distribution of the memory cells MT in the inner string units SU. As a result of inconsistencies in the post-erase threshold distribution between the plurality of string units SU in the same block BLK, there is a possibility of inconsistencies in reliability arising between the plurality of string units SU.

Therefore, the third embodiment attempts to establish uniformity in the erase performance between the plurality of string units SU and to reduce the resulting inconsistencies in the post-erase threshold distribution thereof by mitigating the erase operation conditions of the outer string units SU by means of the erase operation conditions of the inner string units SU, in the semiconductor storage device.

An erase process of each of the memory cells MT in the memory cell array 2 will be explained using FIG. 5. In the erase process, a relatively low voltage (word line voltage) is applied to each of the word lines WL (each conductive film) in the block BLK, a relatively high voltage (channel application voltage) is applied via the bit lines BL and/or source line SL (source layer in the semiconductor substrate SUB) to the channel region (semiconductor channel 42), and a voltage that is a predetermined value lower than the channel voltage and higher than the word line voltage is applied to the select gate SGD and/or select gate SGS. Accordingly, as a result of electron-hole pairs being generated by GIDL (Gate Induced Drain Leakage) in the vicinity of the drain of the selection transistor SDT and/or selection transistor SST, and charge (holes, for example) of a reverse polarity to the stored charge being injected from the channel region (the semiconductor channel 42) to the insulating film 43 (charge storage layer) of each memory cell MT, charge (electrons, for example) that has stored in the insulating film 43 of each memory cell MT is erased, thereby lowering the threshold voltage of each memory cell MT to induce an erased state. This erase process is normally performed for all the blocks BLK at the same time according to a common condition.

However, according to the third embodiment, in the erase process for the blocks BLK in the memory cell array 2, the erase operation conditions of the outer string units SU are mitigated by the erase operation conditions of the inner string units SU. That is, a voltage difference between the channel application voltage and the word line voltage in the outer string units SU is made smaller than a voltage difference between the channel application voltage and the word line voltage in the inner string units by changing the value of the channel application voltage. The channel application voltage is controlled by the bit line voltage and/or the source line voltage, but the source line SL and/or bit lines BL is/are common to the outer string units SU and inner string units SU. Therefore, the erase operation for the inner string units SU and the erase operation for the outer string units SU, in the blocks BLK, are performed in separate time periods.

For example, erase management information 2b3 which is stored in the ROM region of the memory cell array 2 includes conditions of each voltage applied at the time of an erase operation of the inner string units SU and at the time of an erase operation of the outer string units SU, as illustrated in FIG. 17. FIG. 17 is a diagram illustrating configuration values of voltages applied at the time of an erase operation according to the third embodiment.

The voltage $V_{SL}$ and/or voltage $V_{BL}$ denotes a voltage which is applied to the source line SL and/or bit lines BL, that is, denotes a voltage (channel application voltage) which is applied to the channel region (semiconductor channel 42). The voltages $V_{SGD1}$ and $V_{SGD2}$ denote voltages (inner SGD driving voltages) which are applied to the driving electrode films 62 and 63 (see FIG. 9) of the inner string units SU1 and SU2. The voltages $V_{SGD0}$ and $V_{SGD3}$ denote voltages (outer SGD driving voltages) which are applied to the driving electrode films 61 and 64 (see FIG. 9) of the outer string units SU0 and SU3. The voltage $V_{SGS}$ denotes a voltage (SGS driving voltage) which is applied to a conductive layer 6-1 (see FIG. 5) constituting the select gate SGS. The voltages $V_{WL0}$ to $V_{WL63}$ denote voltages (word line voltages) which are applied to conductive layers 6-2 to 6-65 constituting the word lines WL0 to WL63.

The selection and non-selection of an erase operation are controlled by rendering the potential of the SGD driving voltage a select potential and a nonselect potential. Furthermore, the quantity of holes injected into the channel region is controlled by the voltage difference between the channel voltage and the SGD driving voltage with a select potential.

Upon referencing the correction information illustrated in FIG. 17, at the time of an erase operation of the inner string units SU, the configuration value of the inner SGD driving voltages $V_{SGD1}$ and $V_{SGD2}$ is the select potential $V_{SL1}$ (5 V, for example), and the configuration value of the outer SGD driving voltages $V_{SGD0}$ and $V_{SGD3}$ is the nonselect potential $V_{US1}$ (10 V, for example). As a result, the voltage difference (20 V−5 V=15 V, for example) between a configuration value $V_{ERA1}$ of the channel application voltages $V_{SL}$ and $V_{BL}$ and the configuration value $V_{SL1}$ of the inner SGD driving voltages $V_{SGD1}$ and $V_{SGD2}$ is larger than the voltage difference (20 V−10 V=10 V, for example) between the configuration value $V_{ERA1}$ of the channel application voltages $V_{SL}$ and $V_{BL}$ and the configuration value $V_{US1}$ of the outer SGD driving voltages $V_{SGD0}$ and $V_{SGD3}$. As a result, holes are selectively injected into the channel region in the inner string units SU, and an erase operation is selectively performed in the inner string units SU.

Similarly, at the time of an erase operation of the outer string units SU, the configuration value of the inner SGD driving voltages $V_{SGD1}$ and $V_{SGD2}$ is the nonselect potential $V_{US1}$ (10 V, for example), and the configuration value of the outer SGD driving voltages $V_{SGD0}$ and $V_{SGD3}$ is the select potential $V_{SL1}$ (5 V, for example). As a result, the voltage difference (18 V−5 V=13 V, for example) between a configuration value $V_{ERA2}$ of the channel application voltages $V_{SL}$ and $V_{BL}$ and the configuration value $V_{SL1}$ of the outer SGD driving voltages $V_{SGD0}$ and $V_{SGD3}$ is larger than the voltage difference (18 V−10 V=8 V, for example) between the configuration value $V_{ERA2}$ of the channel application voltages $V_{SL}$ and $V_{BL}$ and the configuration value $V_{US1}$ of the inner SGD driving voltages $V_{SGD1}$ and $V_{SGD2}$. As a result, holes are selectively injected into the channel region in the outer string units SU, and an erase operation is selectively performed in the outer string units SU.

Here, the configuration value $V_{ERA2}$ of the channel application voltages $V_{SL}$ and $V_{BL}$ at the time of the erase operation of the outer string units SU is smaller than the configuration value $V_{ERA1}$ of the channel application voltages $V_{SL}$ and $V_{BL}$ at the time of the erase operation of the inner string units SU. Accordingly, the quantity of holes injected into the channel region at the time of the erase operation of the outer string units SU can be suppressed as compared with the quantity of holes injected into the channel region at the time of the erase operation of the inner string units SU. That is, by executing control using the correction information illustrated in FIG. 17, the conditions of the erase operation of the outer string units SU can be mitigated by the conditions of the erase operation of the inner string units SU.

Note that, both at the time of an erase operation of the inner string units SU and at the time of an erase operation of the outer string units SU, the configuration value of the SGS driving voltage $VS_GS$ is a nonselect potential $V_{US2}$ (20 V, for example), and the configuration value of the WL driving voltages $V_{WL0}$ to $V_{WL63}$ is an erase potential $V_{ERA\_WL}$ (0.5 V, for example).

Figure 18:
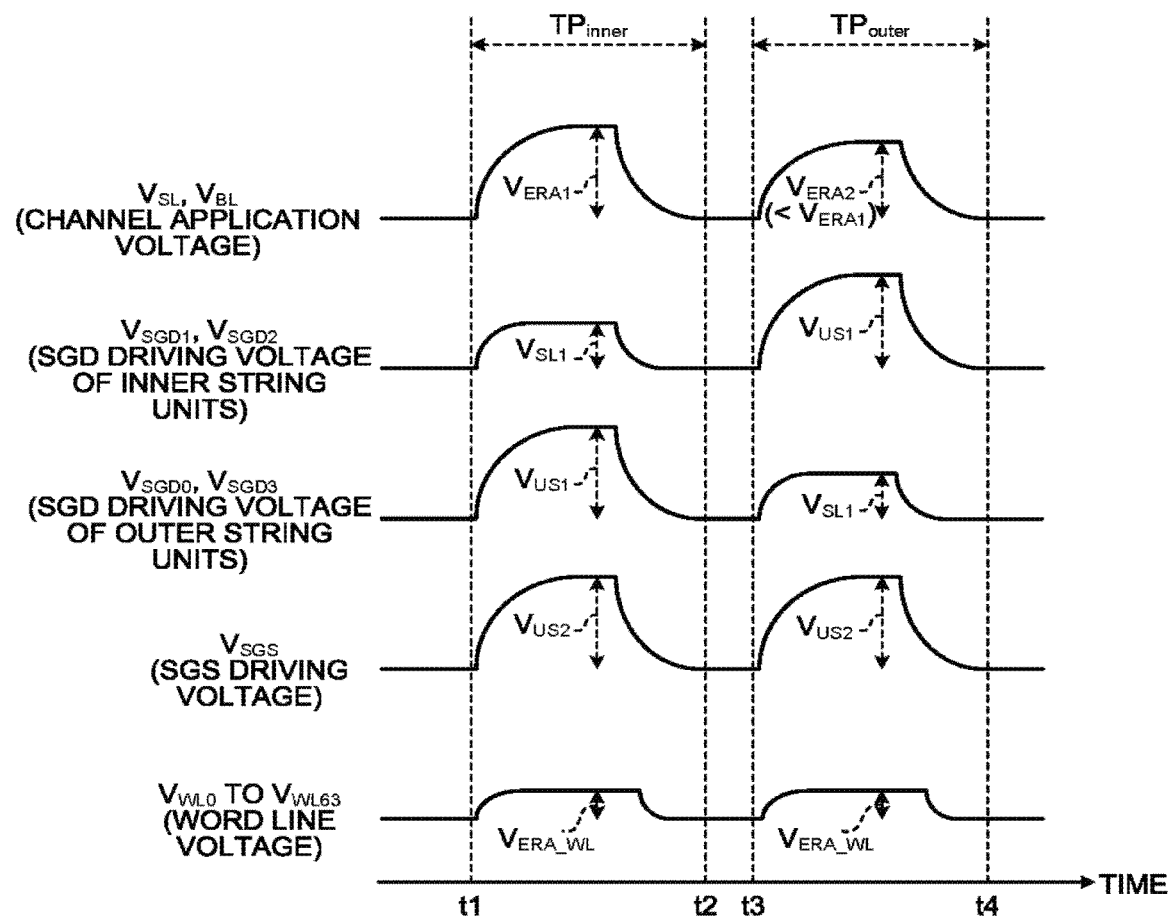
FIG. 18 is a waveform diagram illustrating voltages applied at the time of an erase operation with respect to the memory cell array included in the semiconductor storage device according to the third embodiment.

For example, the peripheral circuit 10 uses the correction information illustrated in FIG. 17 to perform control of an erase operation like that illustrated in FIG. 18. FIG. 18 is a waveform diagram illustrating the erase operation according to the third embodiment.

At timing t1, the peripheral circuit 10 applies an erase potential $V_{ERA1}$ (20 V, for example) as a channel application voltage to the channel region (semiconductor channel 42) via the source line SL and/or bit lines BL. The SGD driver circuit 13 applies the select potential $V_{SL1}$ (5 V, for example) as the driving voltages $V_{SGD1}$ and $V_{SGD2}$ to the driving electrode films 62 and 63 of the inner string units SU1 and SU2, and applies the nonselect potential $V_{US1}$ (10 V, for example) as the driving voltages $V_{SGD0}$ and $V_{SGD3}$ to the driving electrode films 61 and 64 of the outer string units SU0 and SU3. Accordingly, holes are selectively injected into the channel region (semiconductor channel 42) in the inner string units SU1 and SU2. In addition, the SGS driver circuit 12 applies the nonselect potential $V_{US1}$ (20 V, for example) to the select gate SGS, and the WL driver circuit 11 applies the erase potential $V_{ERA\_WL}$ to each of the word lines WL0 to WL63. Accordingly, holes are selectively injected from the channel region (semiconductor channel 42) into the insulating film 43 of the memory cells MT, in the inner string units SU1 and SU2 (see FIG. 5). As a result, charge that has stored in the insulating film (first charge storage layer) 43 of the memory cells MT can be erased, and the memory cells MT can be placed in an erased state.

Thereafter, the peripheral circuit 10 configures each of the applied voltages at a reference potential (ground potential or 0 V, for example).

At timing t2, each of the applied voltages is at the reference potential (ground potential or 0 V, for example), and the erase operation for the inner string units SU1 and SU2 is complete. That is, a period TPinner from timing t1 to t2 is a period in which the erase operation for the inner string units SU1 and SU2 is performed.

At timing t3, the peripheral circuit 10 applies an erase potential $V_{ERA2}$ (18 V, for example) as a channel application voltage to the channel region (semiconductor channel 42) via the source line SL and/or bit lines BL. The SGD driver circuit 13 applies the select potential $V_{SL1}$ (5 V, for example) as the driving voltages $V_{SGD0}$ and $V_{SGD3}$ t0 the driving electrode films 61 and 64 of the outer string units SU0 and SU3, and applies the nonselect potential $V_{US1}$ (10 V, for example) as the driving voltages $V_{SGD1}$ and $V_{SGD2}$ to the driving electrode films 62 and 63 of the inner string units SU1 and SU2. Accordingly, holes are selectively injected into the channel region in the outer string units SU0 and SU3. In addition, the SGS driver circuit 12 applies the nonselect potential $V_{US1}$ (20 V, for example) to the select gate SGS, and the WL driver circuit 11 applies the erase potential $V_{ERA\_WL}$ to each of the word lines WL0 to WL63. Accordingly, holes are selectively injected from the channel region (semiconductor channel 42) into the insulating film 43 of the memory cells MT, in the outer string units SU0 and SU3 (see FIG. 5). As a result, charge that has stored in the insulating film (second charge storage layer) 43 of the memory cells MT can be erased, and the memory cells MT can be placed in an erased state.

Thereafter, the peripheral circuit 10 configures each of the applied voltages at a reference potential (ground potential or 0 V, for example).

At timing t4, each of the applied voltages is at the reference potential (ground potential or 0 V, for example), and the erase operation for the outer string units SU0 and SU3 is complete. That is, a period TPouter from timing t3 to t4 is a period in which the erase operation for the outer string units SU0 and SU3 is performed.

As described hereinabove, in the third embodiment, the conditions for the erase operation of the outer string units SU can be mitigated by the conditions for the erase operation of the inner string units SU, in the semiconductor storage device 1. Accordingly, uniformity in the erase performance between the plurality of string units SU can be established, and inconsistencies in the post-erase threshold distribution between the plurality of string units SU can be reduced.

Note that, in the third embodiment, an erase process of the memory cell array 2 illustrated in FIG. 4 was primarily explained, but the principle behind the third embodiment is also applicable to the memory cell array 2 illustrated in FIG. 11.

Furthermore, the mitigation of the conditions of the erase operation of the outer string units SU by means of the erase operation conditions of the inner string units SU may also be performed by changing the select potential of the SGD driving voltage in the outer string units SU and the inner string units SU. In this case, a voltage difference between the channel application voltage and the word line voltage in the outer string units SU can be made smaller than a voltage difference between the channel application voltage and the word line voltage in the inner string units while using an erase potential of a common channel application voltage in the outer string units SU and the inner string units SU. Therefore, the erase operation for the inner string units SU and the erase operation for the outer string units SU, in the blocks BLK, can be performed simultaneously.

For example, the erase management information 2b3 which is stored in the ROM region of the memory cell array 2 includes conditions of each voltage applied at the time of a simultaneous erase operation of the inner string units SU and the outer string units SU, as illustrated in FIG. 19. FIG. 19 is a diagram illustrating configuration values of voltages applied at the time of an erase operation in a modified example of the third embodiment.

Upon referencing the correction information 2b3 illustrated in FIG. 19, at the time of the simultaneous erase operation, the configuration value of the inner SGD driving voltages $V_{SGD1}$ and $V_{SGD2}$ is the select potential $V_{SL3}$ (3 V, for example), and the configuration value of the outer SGD driving voltages $V_{SGD0}$ and $V_{SGD3}$ is the select potential $V_{SL1}$ (5 V, for example). As a result, the voltage difference (20 V−5 V=15 V, for example) between a configuration value $V_{ERA1}$ of the channel application voltages $V_{SL}$ and $V_{BL}$ and the configuration value $V_{SL1}$ of the outer SGD driving voltages $V_{SGD0}$ and $V_{SGD3}$ can be made small in comparison with the voltage difference (20 V−3 V=18 V, for example) between the configuration value $V_{ERA1}$ of the channel application voltages $V_{SL}$ and $V_{BL}$ and the configuration value $V_{SL1}$ of the inner SGD driving voltages $V_{SGD1}$ and $V_{SGD2}$. Accordingly, at the time of the simultaneous erase operation, the quantity of holes injected into the channel region of the outer string units SU can be suppressed as compared with the quantity of holes injected into the channel region of the inner string units SU. That is, by executing control using the correction information illustrated in FIG. 19, the conditions for the erase operation of the outer string units SU can be mitigated as compared with the conditions for the erase operation of the inner string units SU.

Note that, at the time of the simultaneous erase operation, the configuration value of the SGS driving voltage $V_{SGS}$ is a nonselect potential $V_{US2}'$ (10 V, for example), and the configuration value of the WL driving voltages $V_{WL0}$ to $V_{WL63}$ is an erase potential $V_{ERA\_WL}$ (0.5 V, for example).

Figure 20:
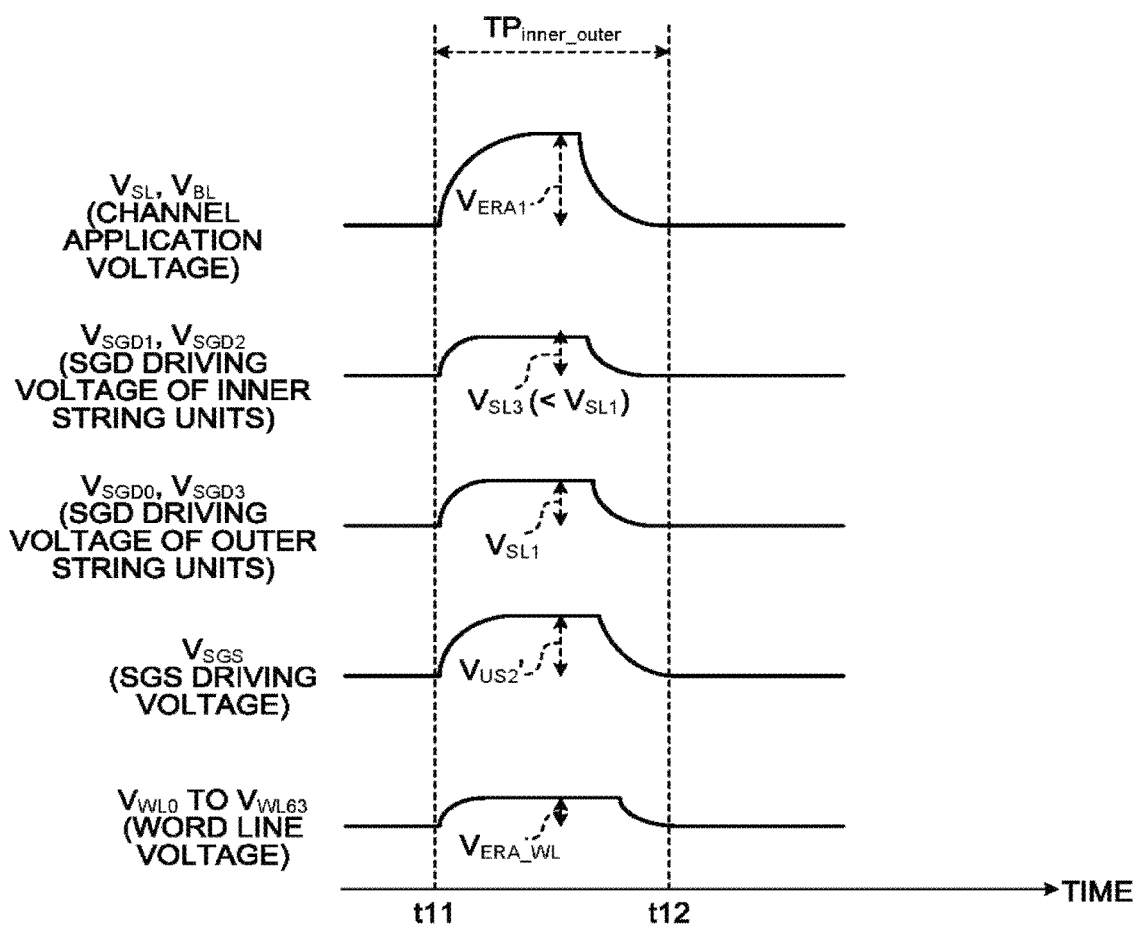
FIG. 20 is a waveform diagram illustrating voltages applied at the time of an erase operation with respect to a memory cell array included in the modified example of the semiconductor storage device according to the third embodiment.

For example, the peripheral circuit 10 uses the correction information 2b3 illustrated in FIG. 19 to perform control of the erase operation like that illustrated in FIG. 20. FIG. 20 is a waveform diagram illustrating an erase operation in a modified example of the third embodiment.

At timing t11, the peripheral circuit 10 applies an erase potential $V_{ERA1}$ (20 V, for example) to the channel region (semiconductor channel 42) via the source line SL and/or bit lines BL. The SGD driver circuit 13 applies the select potential $V_{SL3}$ (3 V, for example) as the driving voltages $V_{SGD1}$ and $V_{SGD2}$ to the driving electrode films 62 and 63 of the inner string units SU1 and SU2, and applies the select potential $V_{SL1}$ (5 V, for example) as the driving voltages $V_{SGD0}$ and $V_{SGD3}$ to the driving electrode films 61 and 64 of the outer string units SU0 and SU3. Accordingly, holes are injected into the channel region in a first quantity in the inner string units SU1 and SU2, and holes are injected into the channel region in a second quantity, which is smaller than the first quantity, in the outer string units SU0 and SU3. In addition, the SGS driver circuit 12 applies the nonselect potential $V_{US2}'$ (10 V, for example) to the select gate SGS, and the WL driver circuit 11 applies the erase potential $V_{ERA\_WL}$ (0.5 V, for example) to each of the word lines WL0 to WL63. Accordingly, holes are injected from the channel region (semiconductor channel 42) into the insulating film 43 of the memory cells MT, in each of the string units SU0 to SU3 (see FIG. 5). As a result, charge that has stored in the insulating film (first charge storage layer) 43 of the memory cells MT in the inner string units SU1 and SU2, and charge that has stored in the insulating film (second charge storage layer) 43 of the memory cells MT in the outer string units SU0 and SU3 are each erased, and each of the memory cells MT can be placed in an erased state. Here, because the quantity of holes present in the channel region of the outer string units SU0 and SU3 that are readily erased can be suppressed as compared with the quantity of holes present in the channel region of the inner string units SU1 and SU2, uniformity in erased states between the plurality of string units SU can be established.

Thereafter, the peripheral circuit 10 configures each of the applied voltages at a reference potential (ground potential or 0 V, for example).

At timing t12, each of the applied voltages is at the reference potential (ground potential or 0 V, for example), and the erase operation for each of the string units SU0 to SU3 is complete. That is, the period TPinner_outer from timing t11 to t12 is a period in which the simultaneous erase operation for the inner string units SU1 and SU2 and the outer string units SU0 and SU3 is performed.

Thus, the conditions of the erase operation for the outer string units SU can be mitigated by the conditions of the erase operation for the inner string units SU also by changing the select potential of the SGD driving voltage in the outer string units SU and the inner string units SU.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
a plurality of first conductive layers stacked in a first direction;
a second conductive layer disposed in the first direction with respect to the plurality of first conductive layers;
a plurality of first division films that respectively divide the plurality of first conductive layers and the second conductive layer in a second direction intersecting the first direction, and that respectively extend through the plurality of first conductive layers and the second conductive layer in the first direction and a third direction intersecting the first direction and the second direction, the second conductive layer including a first region disposed between two first films among the plurality of first division films:
a plurality of second division films that respectively divide the first region of the second conductive layer, in the second direction, and that respectively extend through the second conductive layer in the first direction and the third direction, the first region including a second region and a third region, the second region disposed between one first film of the two first films and a second film, the second film being the nearest among the plurality of second division films to the one first film, the third region disposed between the second film and a third film, the third film being the second nearest among the plurality of second division films to the one first film;
a first pillar-shaped portion including a first semiconductor layer, the first semiconductor layer extending m the first direction through the plurality of first conductive layers and the third region of the second conductive layer;
a second pillar-shaped portion including a second semiconductor layer, the second semiconductor layer extending in the first direction through the plurality of first conductive layers and the second region of the second conductive layer;
a first charge storage layer disposed between the first semiconductor layer and the plurality of first conductive layers;
a second charge storage layer disposed between the second semiconductor layer and the plurality of first conductive layers; and
a peripheral circuit configured to apply a first initial write voltage to a first layer among the plurality of first conductive layers when the peripheral circuit supplies a select potential to the third region of the second conductive layer, and configured to apply a second initial write voltage to the first layer when the peripheral circuit supply the select potential to the second region of the second conductive layer,
wherein the first initial write voltage is different from the second initial write voltage.

2. The semiconductor storage device according to claim 1, wherein the first initial write voltage is higher than the second initial write voltage.

3. The semiconductor storage device according to claim 1, further comprising a substrate,
wherein the peripheral circuit applies a third initial write voltage to a second layer among the plurality of first conductive layers when the peripheral circuit supplies the select potential to the third region of the second conductive layer, the second layer being located between the first layer and the substrate in the first direction, and applies a fourth initial write voltage to the second layer when the peripheral circuit supplies the select potential to the second region of the second conductive layer,
wherein the third initial write voltage is different from fourth initial write voltage.

4. The semiconductor storage device according to claim 3, wherein
the first initial write voltage is higher than the second initial write voltage, and
the third initial write voltage is higher than the fourth initial write voltage.

5. The semiconductor storage device according to claim 3, wherein the peripheral circuit applies a fifth initial write voltage to a third layer among the plurality of first conductive layers when the peripheral circuit supplies the select potential to the third region of the second conductive layer, the third layer being located between the second layer and the substrate in the first direction, and applies a sixth initial write voltage to the third layer when the peripheral circuit supplies the select potential to the second region of the second conductive layer,
wherein the fifth initial write voltage is different from the sixth initial write voltage.

6. The semiconductor storage device according to claim 5, wherein the first initial write voltage is higher than the second initial write voltage,
the third initial write voltage is higher than the fourth initial write voltage, and
the fifth initial write voltage sixth initial write voltage.

7. The semiconductor storage device according to claim 1, wherein the semiconductor storage device is mounted as a semiconductor chip, and
a differential between the first initial write voltage and the second initial write voltage is determined according to a plan position in the third region and the second region in the semiconductor chip.

8. The semiconductor storage device according to claim 1,
wherein the semiconductor storage device is mounted as a semiconductor wafer, and
a differential between the first initial write voltage and the second initial write voltage is determined according to a plan position in the third region and the second region in the semiconductor wafer.

9. The semiconductor storage device according to claim 3,
wherein a differential between the third initial write voltage and the fourth initial write voltage is smaller than a differential between the first initial write voltage and the second initial write voltage.

10. The semiconductor storage device according to claim 5,
wherein a differential between the third initial write voltage and the fourth initial write voltage is smaller than a differential between the first initial write voltage and the second initial write voltage, and
a differential between the firth initial write voltage and the sixth initial write voltage is smaller than a differential between the third initial write voltage and the fourth initial write voltage.

11. The semiconductor storage device according to claim 1,
wherein, when the peripheral circuit has received a write instruction including sequential physical addresses, the peripheral circuit changes a data write operation order from physical address order.

12. The semiconductor storage device according to claim 1,
wherein, in a first period, the peripheral circuit applies the first initial write voltage to the first layer and supplies the select potential to the third region of the second conductive layer and, in a second period after the first period, the peripheral circuit applies the second initial write voltage to the first layer and supplies tire select potential to the second region of the second conductive layer.

13. The semiconductor storage device according to claim 12, further comprising:
a third pillar-shaped portion including third semiconductor layer, the third semiconductor layer extending in the first direction through the plurality of first conductive layers and a fourth region of the second conductive layer, the fourth region disposed between the third film and a fourth film, the fourth film being the third nearest among the plurality of second division films to the one first film; and
a third charge storage layer disposed between the third semiconductor layer and the plurality of first conductive layers,
wherein, in a third period before the first period, the peripheral circuit applies a seventh initial write voltage to the first layer when the peripheral circuit supplies the select potential to the fourth region of the second conductive layer,
the seventh initial write voltage is different from the first initial write voltage, and
the seventh initial write voltage is different from the second initial write voltage.

14. The semiconductor storage device according to claim 1,
wherein the peripheral circuit erases, under a first condition, charge that has stored in the first charge storage layer and erases, under a second condition that is mitigated as compared with the first condition, charge that has stored in the second charge storage layer.

15. The semiconductor storage device according to claim 1, further comprising:
a third pillar-shaped portion including third semiconductor layer, the third semiconductor layer extending in the first direction through the plurality of first conductive layers and a fourth region of the second conductive layer, the fourth region disposed between the third film and a fourth film, the fourth film being the third nearest among the plurality of second division films to the one first film; and
a third charge storage layer disposed between the third semiconductor layer and the plurality of first conductive layers,
wherein the peripheral circuit erases, under a first condition, charge that has stored in the first charge storage layer, erases, under a third condition, charge that has stored in the third charge storage layer, and erases, under a second condition that is mitigated as compared with the first condition and the third condition, charge that has stored in the second charge storage layer.

16. The semiconductor storage device according to claim 14,
wherein the first condition includes configuring a first value for a difference between the voltage applied to the first semiconductor pillar and the voltage applied to the third region, and
the second condition includes configuring a second value which is smaller than the first value for a difference between the voltage applied to the second semiconductor pillar and the voltage applied to the second region.

17. The semiconductor device according to claim 16, wherein,
in a fourth period, the peripheral circuit applies a first voltage to the first semiconductor layer and applies a second voltage to the plurality of first conductive layers in a state where a select potential is supplied to the third region and a nonselect potential is applied to the second region, and wherein, in a fifth period, the peripheral circuit applies a third voltage that is lower than the first voltage to the second semiconductor layer and applies the second voltage to the plurality of first conductive layers, in a state where the nonselect potential is applied to the third region and the select potential is supplied to the second region.

18. The semiconductor device according to claim 16, wherein,
in a sixth period, the peripheral circuit applies a first voltage to the first semiconductor layer and to the second semiconductor layer, and applies a second voltage to the first region, in a state where a first select potential has been supplied to the second region and a second select potential that is lower than the first select potential has been supplied to the third region, in the second conductive layer.

19. The semiconductor storage device according to claim 13,
wherein the seventh initial write voltage is higher than the first initial write voltage, and
the first initial write voltage is higher than the second initial write voltage.

20. The semiconductor storage device according to claim 1, wherein
the first initial write voltage is a voltage for the peripheral circuit to initially apply to the first layer during a write process in which write operations are repeated while increasing write voltages, when the peripheral circuit supplies the select potential to the third region of the second conductive layer, and the second initial write voltage is a voltage for the peripheral circuit to initially apply to the first layer during the write process, when the peripheral circuit supplies the select potential to the third region of the second conductive layer.

\* \* \* \* \*